(12) United States Patent
Cheng

(10) Patent No.: US 11,916,004 B2
(45) Date of Patent: Feb. 27, 2024

(54) ELECTRONIC DEVICE

(71) Applicant: Advanced Semiconductor Engineering, Inc., Kaohsiung (TW)

(72) Inventor: Ching-Feng Cheng, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 245 days.

(21) Appl. No.: 17/467,119

(22) Filed: Sep. 3, 2021

(65) Prior Publication Data
US 2023/0075021 A1  Mar. 9, 2023

(51) Int. Cl.
*H01L 23/498* (2006.01)
*H01L 25/16* (2023.01)
*H01L 23/13* (2006.01)

(52) U.S. Cl.
CPC ........ *H01L 23/49833* (2013.01); *H01L 23/13* (2013.01); *H01L 23/49816* (2013.01); *H01L 23/49827* (2013.01); *H01L 25/162* (2013.01)

(58) Field of Classification Search
CPC ... H01L 23/481; H01L 23/498; H01L 23/552; H01L 23/5384–5389; H01L 23/49833; H01L 23/49816; H01L 23/49827; H01L 25/105; H01L 25/16; H01L 25/162; H01L 25/0756; H05K 1/14; H05K 1/141–147; H05K 1/18; H05K 1/181–188
USPC ............................ 361/770–795; 257/660–730
See application file for complete search history.

(56) References Cited

U.S. PATENT DOCUMENTS

| | | | | |
|---|---|---|---|---|
| 6,853,061 | B2* | 2/2005 | Frutschy | H05K 1/0263 257/E23.079 |
| 8,709,934 | B2* | 4/2014 | Kim | H05K 3/3436 257/737 |
| 2011/0298119 | A1* | 12/2011 | Cho | H01L 23/49816 438/109 |
| 2013/0285237 | A1* | 10/2013 | Yu | H01L 23/49811 257/E23.021 |
| 2014/0061897 | A1* | 3/2014 | Lin | H01L 24/17 257/737 |
| 2014/0167254 | A1* | 6/2014 | Yu | H01L 24/17 257/737 |
| 2014/0252657 | A1* | 9/2014 | Liu | H01L 21/565 257/782 |
| 2018/0151495 | A1* | 5/2018 | Hsu | H01L 24/17 |
| 2019/0074264 | A1* | 3/2019 | Chen | H01L 23/5385 |
| 2019/0311978 | A1* | 10/2019 | Cheah | H01L 23/49838 |
| 2020/0303334 | A1* | 9/2020 | Liu | H01L 24/13 |
| 2021/0091017 | A1* | 3/2021 | Yeon | H01L 23/552 |
| 2023/0282959 | A1* | 9/2023 | Yeon | H01Q 9/0414 343/702 |

* cited by examiner

*Primary Examiner* — Tuan T Dinh
(74) *Attorney, Agent, or Firm* — FOLEY & LARDNER LLP

(57) ABSTRACT

An electronic device is provided. The electronic device includes a first carrier having a first surface, an interposer disposed over the first surface of the first carrier, wherein the interposer has a first thickness and a second thickness in a direction substantially perpendicular to the first surface of the first carrier; and a plurality of electrical connections between the first carrier and the interposer and configured to compensate a difference between the first thickness and the second thickness of the interposer.

9 Claims, 39 Drawing Sheets

ELECTRONIC DEVICE

BACKGROUND

1. Field of the Disclosure

The instant disclosure relates to, amongst other things, a semiconductor device package and method of manufacturing the same.

2. Description of Related Art

In a typical 3D stacking module, the interposers are used to connect and support two boards. However, since the total thickness variation (TTV) of the upper (lower) substrate, the electrical connections and the interposers may be large, the interposers may not properly connect the upper and lower substrates.

SUMMARY

According to one example embodiment of the instant disclosure, an electronic device includes a first carrier having a first surface, an interposer disposed over the first surface of the first carrier, wherein the interposer has a first thickness and a second thickness in a direction substantially perpendicular to the first surface of the first carrier; and a plurality of electrical connections between the first carrier and the interposer and configured to compensate a difference between the first thickness and the second thickness of the interposer.

According to another example embodiment of the instant disclosure, an electronic device includes a first carrier, an interposer on the first carrier, a first electrical connection connecting the interposer to the first carrier; and a second electrical connection connecting the interposer to the first carrier and spaced apart from the first electrical connection. A distance between the first carrier and the interposer and adjacent to the first electrical connection is different from a distance between the first carrier and the interposer and adjacent to the second electrical connection.

According to another example embodiment of the instant disclosure, an electronic device includes a first carrier; an interposer disposed on the first carrier, a first electrical connection between the first carrier and the interposer; a second carrier disposed on the interposer and a second electrical connection between the second carrier and the interposer. A distance between the second carrier and the interposer is greater than a distance between the first carrier and the interposer.

In order to further understanding of the instant disclosure, the following embodiments are provided along with illustrations to facilitate appreciation of the instant disclosure; however, the appended drawings are merely provided for reference and illustration, and do not limit the scope of the instant disclosure.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
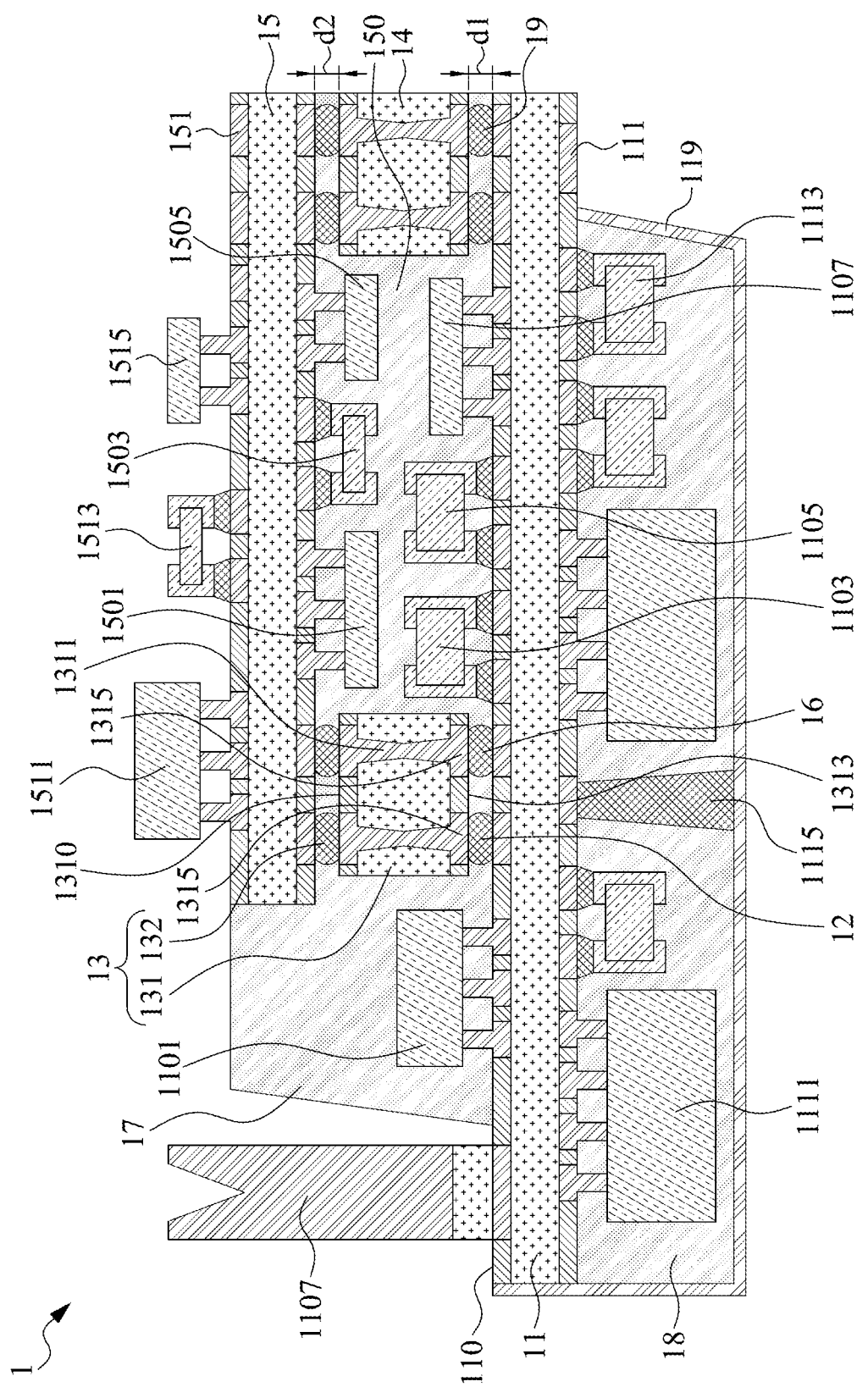
FIG. 1 is a cross-sectional view of a semiconductor device package in accordance with an embodiment of the instant disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features are formed or disposed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

As used herein, spatially relative terms, such as "beneath," "below," "above," "over," "on," "upper," "lower," "left," "right," "vertical," "horizontal," "side" and the like, may be used herein for ease of description to describe one element or feature's relationship to another element(s) or feature(s) as illustrated in the Figures. The spatially relative terms are intended to encompass different orientations of the device in use or operation in addition to the orientation depicted in the Figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

Present disclosure provides a semiconductor device package including a main semiconductor device assembly and a sub-semiconductor device assembly disposed on a substrate of the main semiconductor assembly. A total thickness variation (TTV) of the sub-semiconductor device assembly may be less than 10 μm, so that interposer of the sub-semiconductor device assembly may properly connect the substrate of the main semiconductor device assembly.

FIG. 1 is a cross-sectional view of a semiconductor device package 1 in accordance with some embodiments of the present disclosure. As shown in FIG. 1, the semiconductor device package 1 includes a main carrier 11, an interposer 13 and a sub-carrier 15. In some embodiments, the main carrier 11 includes a substrate, which may be a core substrate or a core-less substrate and may include traces, pads or interconnections for electrical connection. Referring to FIG. 1, the main carrier 11 has a surface 110 (e.g., an upper surface) and a surface 111 (e.g., a lower surface), and electronic components 1101, 1103, 1105 and 1107 may be disposed or mounted on the surface 110 of the main carrier 11 and electronic components 1111 and 1113 may be disposed or mounted on the surface 111 of the main carrier 11. The electronic component 1101, 1103, 1105, 1107, 1111 and 1113 may be a die, an active device, a passive device, and/or other electronic devices. In some embodiments of the present disclosure, the electronic components 1101, 1103, 1105, 1107, 1111 and 1113 may electrically connect the main carrier 11 via electrical connections.

As shown in FIG. 1, the interposer 13 is disposed or mounted on the surface 110 of the main carrier 11. The interposer 13 may include a substrate 131 and electrical connections 132. The substrate 131 may include conductive vias 1311. In some embodiments of the present disclosure, the conductive via 1311 is a through silicon via (TSV). Further, the substrate 131 includes a surface 1310 (e.g., an upper surface) and the electrical connections 132 are disposed on the surface 1310 of the substrate 131. In some embodiments of the present disclosure, the electrical connection 132 includes solder material. The electrical connection 132 may include a solder ball. Referring to FIG. 1, the interposer 13 electrically connects to the main carrier 11 via electrical connections 12 and 16. That is, the electrical connections 12 and 16 are arranged between the surface 110 of the main carrier 11 and a surface 1313 (e.g., a lower surface) of the substrate 131 of the interposer 13. The substrate 131 of the interposer 13 may include electrodes 1315 at the surface 1313, and the electrical connections 12 and 16 may be connected to the electrodes 1315 of the substrate 131 of the interposer 13. In some embodiments of the present disclosure, the electrode 1315 includes a pad. In some embodiments of the present disclosure, the electrical connections 12 and 16 include solder material used for soldering with the electrodes 1315 of the interposer 13. The electrical connections 12 and 16 may include solder balls. In some embodiments of the present disclosure, a volume of the electrical connection 12 and a volume of the electrical connection 16 are different from each other. In some embodiments of the present disclosure, a volume of the solder material of the electrical connection 12 is different from a volume of the solder material of the electrical connection 16. In some embodiments of the present disclosure, a volume of the electrical connection 132 is greater than the volume of the electrical connection 12. In some embodiments of the present disclosure, a volume of the electrical connection 132 is greater than the volume of the electrical connection 16. In some embodiments of the present disclosure, a volume of the solder material the electrical connection 132 is greater than the volume the solder material of the electrical connection 12. In some embodiments of the present disclosure, a volume of the solder material the electrical connection 132 is greater than the volume the solder material of the electrical connection 16. In some embodiments of the present disclosure, a thickness of the electrical connection 132 is greater than a thickness of the electrical connection 12. In some embodiments of the present disclosure, a thickness of the electrical connection 132 is greater than a thickness of the electrical connection 16.

The sub-carrier 15 is disposed on the interposers 13. In some embodiments, the sub-carrier 15 includes a substrate, which may be a core substrate or a core-less substrate and may include traces, pads or interconnections for electrical connection. Referring to FIG. 1, the sub-carrier 15 has a surface 150 (e.g., a lower surface) and a surface 151 (e.g., an upper surface), and electronic components 1501, 1503 and 1505 may be disposed or mounted on the surface 150 of the sub-carrier 15 and electronic components 1511, 1513 and 1515 may be disposed or mounted on the surface 151 of the sub-carrier 15. The electronic component 1501, 1503, 1505, 1511, 1513 and 1515 may be a die, an active device, a passive device, and/or other electronic devices. In some embodiments of the present disclosure, the electronic components 1501, 1503, 1505, 1511, 1513 and 1515 may electrically connect the main carrier 15 via electrical connections.

The electrical connections 132 of the interposer 13 is configured to abut and/or connect the surface 150 of the sub-carrier 15. That is, the sub-carrier 15 is electrically connected the interposer 13 via the electrical connections 132. The distance d2 between the surface 150 of the sub-carrier 15 and the surface 1310 of the substrate 131 of the interposer 13 is greater than the distance d1 between the surface 110 of the main-carrier 11 and the surface 1313 of the substrate 131 of the interposer 13.

In some embodiments of the present disclosure, there is another interposer 14 disposed or mounted on the surface 110 of the main carrier 11, and the sub-carrier 15 is disposed on the interposer 14. The interposer 14 is spaced apart from the interposer 13. The interposer 14 may electrically connect to the main carrier 11 via electrical connections 19. In some embodiments of the present disclosure, the electrical connection 19 includes solder material. The electrical connection 19 may include solder balls. In some embodiments of the present disclosure, a volume of the electrical connection 19 and the volume of the electrical connection 12 or 16 are different from each other. In some embodiments of the present disclosure, a volume of the solder material of the electrical connection 19 is different from the volume of the solder material of the electrical connection 12 or 16.

In some embodiments of the present disclosure, a total thickness variation (TTV) of the electrical connections 12, 16, the interposers 13, 14 and the sub-carrier 15 may be less than 10 μm.

Referring to FIG. 1, an encapsulant 17 (i.e., package body) is disposed on the surface 110 of the main-carrier 11.

The encapsulant 17 may cover the surface 110 of the main-carrier 11, the electronic components 1101, 1103, 1105 and 1107 disposed on the surface 110 of the main carrier, the interposers 13 and 14, the electrical connections 12 and 16, the surface 150 of the sub-carrier 15 and the electronic components 1501, 1053 and 1505 disposed on the surface 150 of the sub-carrier 15. The encapsulant 17 may include molding compounds, such as a Novolac-based resin, an epoxy-based resin, a silicone-based resin, or other another suitable encapsulant; fillers such as silicon oxide fillers, may be included in the molding compound. In addition, the encapsulant 17 may include a molding underfill (MUF) or a capillary underfill (CUF). Further, as shown in FIG. 1, a portion of the surface 110 of the main carrier 11 is not covered by the encapsulant 17, and the electronic component 1107 is disposed or mounted on the portion of the surface 110 of the main-carrier 11. In some embodiments of the present disclosure, the electronic component 1107 includes a connector which is configured to connect the main carrier 11 to an external electronic component.

Moreover, an encapsulant 18 (i.e., package body) is disposed on the surface 111 of the main carrier 11. The encapsulant 18 may cover the surface 111 of the main-carrier 11 and the electronic components 1111 and 1113 disposed on the surface 111 of the main carrier 11. The encapsulant 18 may include molding compounds, such as a Novolac-based resin, an epoxy-based resin, a silicone-based resin, or other another suitable encapsulant; fillers such as silicon oxide fillers, may be included in the molding compound. In addition, the encapsulant 18 may include a molding underfill (MUF) or a capillary underfill (CUF). In some embodiments of the present disclosure, a conductive layer 119 is formed on the encapsulant 18. The conductive layer 119 may be a shielding layer which electrically connects to the main carrier 11 via a conductive via 1115.

Figure 2A:
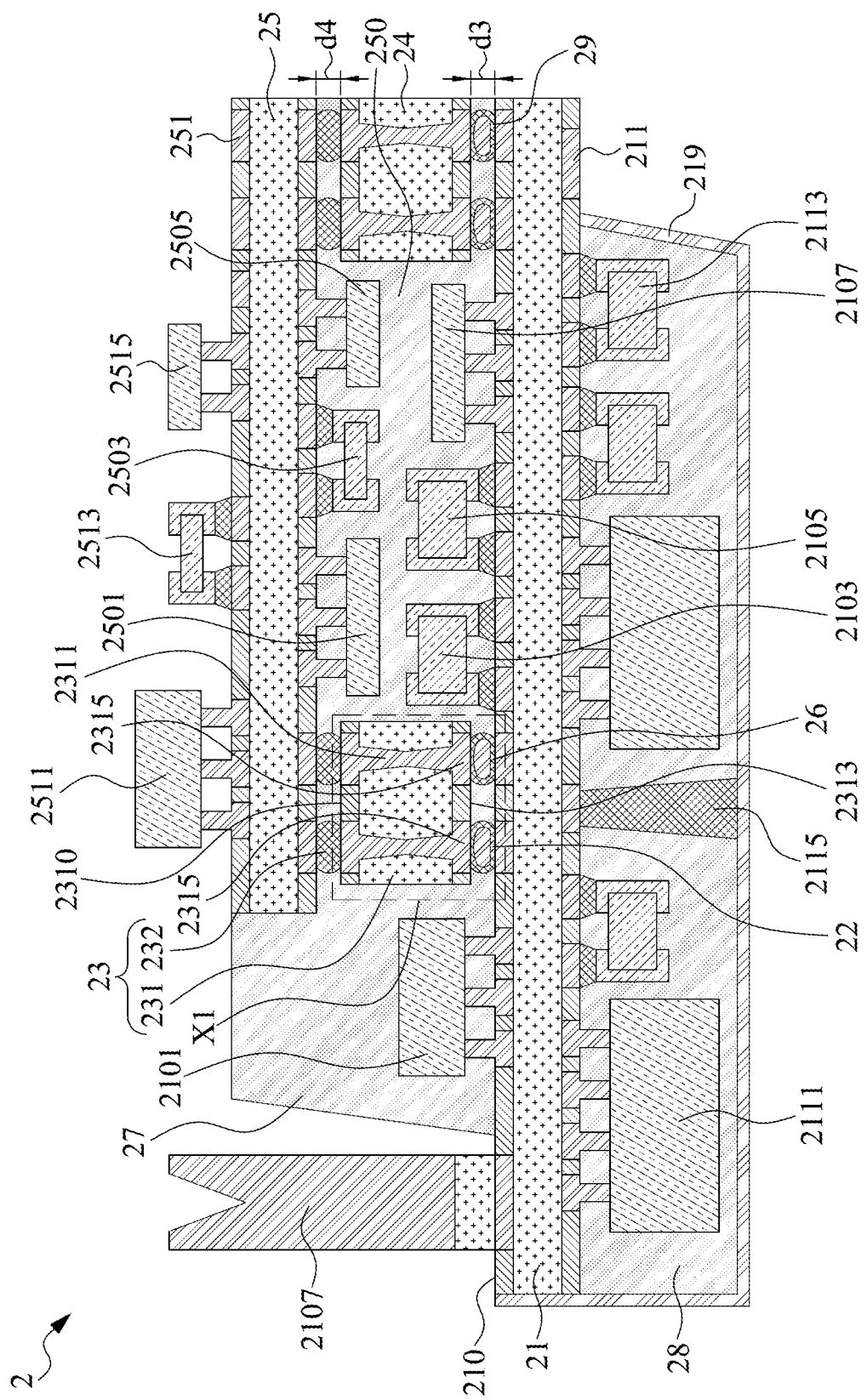
FIG. 2A is a cross-sectional view of a semiconductor device package in accordance with an embodiment of the instant disclosure.

FIG. 2A is a cross-sectional view of a semiconductor device package 2 in accordance with some embodiments of the present disclosure. As shown in FIG. 2A, the semiconductor device package 2 includes a main carrier 21, an interposer 23 and a sub-carrier 25. In some embodiments, the main carrier 21 includes a substrate, which may be a core substrate or a core-less substrate and may include traces, pads or interconnections for electrical connection. Referring to FIG. 2A, the main carrier 21 has a surface 210 (e.g., an upper surface) and a surface 211 (e.g., a lower surface), and electronic components 2101, 2103, 2105 and 2017 may be disposed or mounted on the surface 210 of the main carrier 21 and electronic components 2111 and 2113 may be disposed or mounted on the surface 211 of the main carrier 21. The electronic component 2101, 2103, 2105, 2017, 2111 and 2113 may be a die, an active device, a passive device, and/or other electronic devices. In some embodiments of the present disclosure, the electronic components 2101, 2103, 2105, 2017, 2111 and 2113 may electrically connect the main carrier 21 via electrical connections.

As shown in FIG. 2A, the interposer 23 is disposed or mounted on the surface 210 of the main carrier 21. The interposer 23 may include a substrate 231 and electrical connections 232. The substrate 231 may include conductive vias 2311. In some embodiments of the present disclosure, the conductive via 2311 is a through silicon via (TSV). Further, the substrate 231 includes a surface 2310 (e.g., an upper surface) and the electrical connections 232 are disposed on the surface 2310 of the substrate 231. In some embodiments of the present disclosure, the electrical connection 232 includes solder material. The electrical connection 232 may include a solder ball. Referring to FIG. 2A, the interposer 23 electrically connects to the main carrier 21 via electrical connections 22 and 26. That is, the electrical connections 22 and 26 are arranged between the surface 210 of the main carrier 21 and a surface 2313 (e.g., a lower surface) of the substrate 231 of the interposer 23. The substrate 231 of the interposer 23 may include electrodes 2315 at the surface 2313, and the electrical connections 22 and 26 may be connected to the electrodes 2315 of the substrate 231 of the interposer 23. In some embodiments of the present disclosure, the electrode 2315 includes a pad. In some embodiments of the present disclosure, the electrical connection 22, 26 may include a spacer and solder material surrounding the spacer. The solder material is used for soldering with the electrodes 2315 of the interposer 23. In some embodiments of the present disclosure, the spacer includes a metal core or a plastic core. In some embodiments of the present disclosure, the metal core is a Cu core. In some embodiments of the present disclosure, a volume of the electrical connection 22 and a volume of the electrical connection 26 are different from each other. In some embodiments of the present disclosure, a volume of the solder material of the electrical connection 22 is different from a volume of the solder material of the electrical connection 26. In some embodiments of the present disclosure, a volume of the electrical connection 232 is greater than the volume of the electrical connection 22. In some embodiments of the present disclosure, a volume of the electrical connection 232 is greater than the volume of the electrical connection 26. In some embodiments of the present disclosure, a volume of the solder material the electrical connection 232 is greater than the volume the solder material of the electrical connection 22. In some embodiments of the present disclosure, a volume of the solder material the electrical connection 232 is greater than the volume the solder material of the electrical connection 26. In some embodiments of the present disclosure, a thickness of the electrical connection 232 is greater than a thickness of the electrical connection 22. In some embodiments of the present disclosure, a thickness of the electrical connection 232 is greater than a thickness of the electrical connection 26

The sub-carrier 25 is disposed on the interposers 23. In some embodiments, the sub-carrier 25 includes a substrate, which may be a core substrate or a core-less substrate and may include traces, pads or interconnections for electrical connection. Referring to FIG. 2A, the sub-carrier 25 has a surface 250 (e.g., a lower surface) and a surface 251 (e.g., an upper surface), and electronic components 2501, 2503 and 2505 may be disposed or mounted on the surface 250 of the sub-carrier 25 and electronic components 2511, 2513 and 2515 may be disposed or mounted on the surface 251 of the sub-carrier 25. The electronic component 2501, 2503, 2505, 2511, 2513 and 2515 may be a die, an active device, a passive device, and/or other electronic devices. In some embodiments of the present disclosure, the electronic components 2501, 2503, 2505, 2511, 2513 and 2515 may electrically connect the main carrier 25 via electrical connections.

The electrical connections 232 of the interposer 23 is configured to abut and/or connect the surface 250 of the sub-carrier 25. That is, the sub-carrier 25 is electrically connected to the interposer 23 via the electrical connections 232. The distance d4 between the surface 250 of the sub-carrier 25 and the surface 2310 of the substrate 231 of the interposer 23 is greater than the distance d3 between the surface 210 of the main-carrier 21 and the surface 2313 of the substrate 231 of the interposer 23.

In some embodiments of the present disclosure, there is another interposer 24 disposed or mounted on the surface 210 of the main carrier 21, and the sub-carrier 25 is disposed on the interposer 24. The interposer 24 is spaced apart from the interposer 23. The interposer 24 may electrically connect to the main carrier 21 via electrical connections 29. In some embodiments of the present disclosure, the electrical connection 29 may include a spacer and solder material surrounding the spacer. In some embodiments of the present disclosure, the spacer includes a metal core or a plastic core. In some embodiments of the present disclosure, the metal core is a Cu core In some embodiments of the present disclosure, a volume of the electrical connection 29 and the volume of the electrical connection 22 or 26 are different from each other. In some embodiments of the present disclosure, a volume of the solder material of the electrical connection 29 is different from the volume of the solder material of the electrical connection 22 or 26.

In some embodiments of the present disclosure, a total thickness variation (TTV) of the electrical connections 22, 26, the interposers 23, 24 and the sub-carrier 25 may be less than 10 μm.

Referring to FIG. 2A, an encapsulant 27 (i.e., package body) is disposed on the surface 210 of the main-carrier 21. The encapsulant 27 may cover the surface 210 of the main-carrier 21, the electronic components 2101, 2103, 2105 and 2107 disposed on the surface 210 of the main carrier 21, the interposers 23 and 24, the electrical connections 22 and 26, the surface 250 of the sub-carrier 25 and the electronic components 2501, 2053 and 2505 disposed on the surface 250 of the sub-carrier 25. The encapsulant 27 may include molding compounds, such as a Novolac-based resin, an epoxy-based resin, a silicone-based resin, or other another suitable encapsulant; fillers such as silicon oxide fillers, may be included in the molding compound. In addition, the encapsulant 27 may include a molding underfill (MUF) or a capillary underfill (CUF). Further, as shown in FIG. 2A, a portion of the surface 210 of the main carrier 21 is not covered by the encapsulant 27, and the component 2107 is disposed or mounted on the portion of the surface 210 of the main-carrier 21. In some embodiments of the present disclosure, the electronic component 2107 includes a connector which is configured to connect the main carrier 21 to an external electronic component.

Moreover, an encapsulant 28 (i.e., package body) is disposed on the surface 211 of the main carrier 21. The encapsulant 28 may cover the surface 211 of the main-carrier 21 and the electronic components 2111 and 2113 disposed on the surface 211 of the main carrier 21. The encapsulant 28 may include molding compounds, such as a Novolac-based resin, an epoxy-based resin, a silicone-based resin, or other another suitable encapsulant; fillers such as silicon oxide fillers, may be included in the molding compound. In addition, the encapsulant 28 may include a molding underfill (MUF) or a capillary underfill (CUF). In some embodiments of the present disclosure, a conductive layer 219 is formed on the encapsulant 28. The conductive layer 219 may be a shielding layer which electrically connects to the main carrier 21 via a conductive via 2115.

Figure 2B:
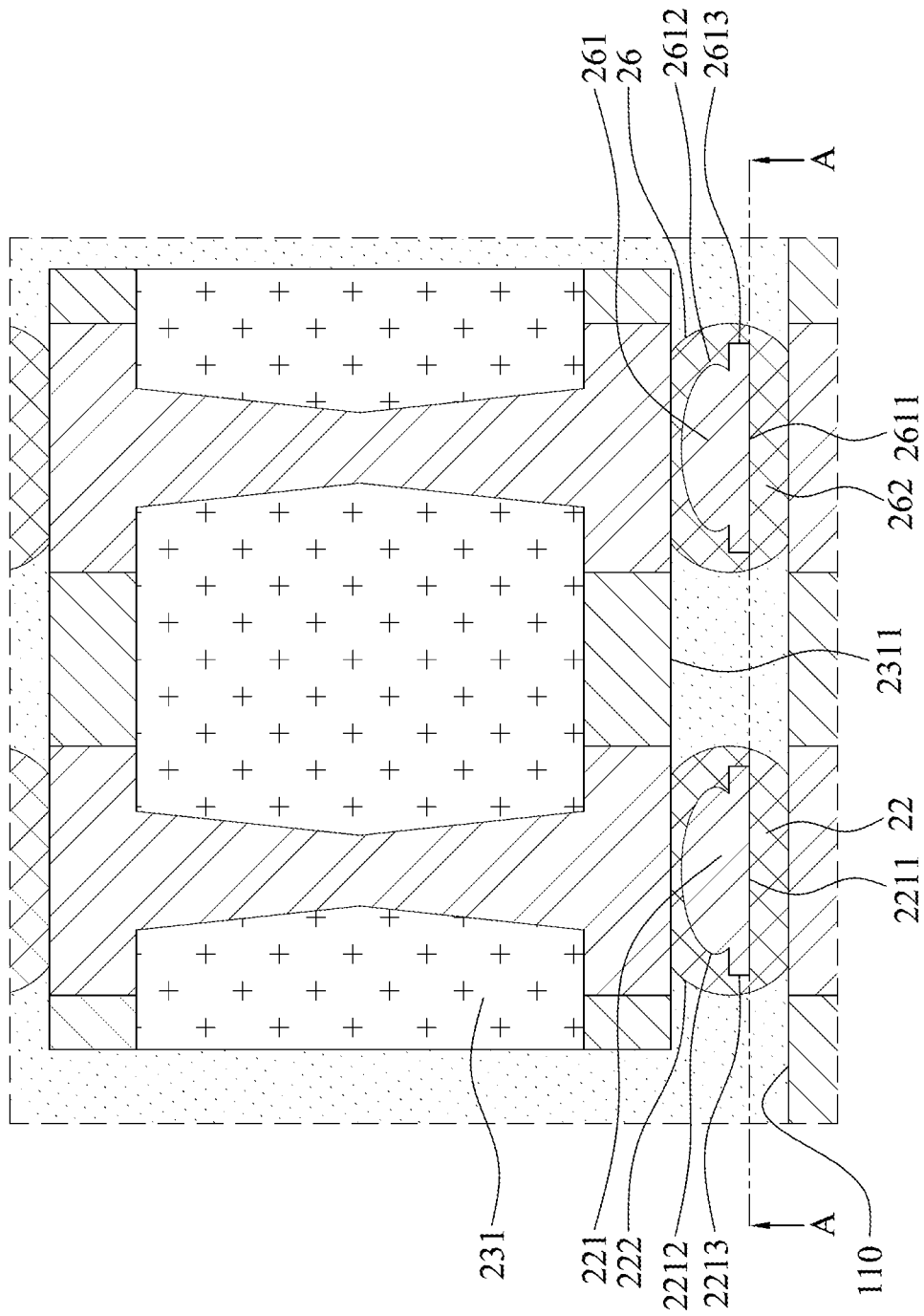
FIG. 2B is an enlarged view of portion "X1" illustrated in FIG. 2A.

FIG. 2B is an enlarged view of portion "X1" illustrated in FIG. 2A. As shown in FIG. 2B, the electrical connections 22 and 26 are arranged between the surface 210 of the main-carrier 21 and the surface 2313 of the substrate 231. The electrical connection 22 may include the spacer 221 and the solder material 222 surrounding the spacer 221, and the electrical connection 26 may include the spacer 261 and the solder material 262 surrounding the spacer 261. As above mentioned, the volume of the solder material 222 of the electrical connection 22 may be different from the volume of the solder material 262 of the electrical connection 26.

Referring to FIG. 2B, the spacer 221 of the electrical connection 22 includes a substantially planar surface 2211 facing the main carrier 21, and the spacer 261 of the electrical connection 26 includes a substantially planar surface 2611 facing the main carrier 21. In some embodiments of the present disclosure, the spacer 221 of the electrical connection 22 includes a protrusion 2213 protruding from a side surface 2212 of the spacer 221 and adjacent to the surface 2211 of the spacer 221. In some embodiments of the present disclosure, a distance between the protrusion 2213 of the spacer 221 of the electrical connection 22 and the surface 210 of the main-carrier 21 is smaller than a distance between the protrusion 2213 of the spacer 221 of the electrical connection 22 and the surface 2313 of the substrate 231 of the interposer 231. That is, a distance between the protrusion 2213 of the spacer 221 of the electrical connection 22 and the main-carrier 21 is smaller than a distance between the protrusion 2213 of the spacer 221 of the electrical connection 22 and the interposer 231. In some embodiments of the present disclosure, the metal core 261 of the electrical connection 26 includes a protrusion 2613 protruding from a side surface 2612 of the metal core 261 and adjacent to the surface 2611 of the metal core 261. In some embodiments of the present disclosure, a distance between the protrusion 2613 of the spacer 261 of the electrical connection 26 and the surface 210 of the main-carrier 21 is smaller than a distance between the protrusion 2613 of the spacer 261 of the electrical connection 26 and the surface 2313 of the substrate 231 of the interposer 23. That is, a distance between the protrusion 2613 of the spacer 261 of the electrical connection 26 and the main-carrier 21 is smaller than a distance between the protrusion 2613 of the spacer 261 of the electrical connection 26 and the interposer 23

Referring to FIG. 2B, the spacer 221, 261 may contact the electrode 2315 of the interposer 23. In some embodiments of the present disclosure, the spacer 221, 261 does not contact the electrode 2315 of the interposer 23.

Figure 2C:
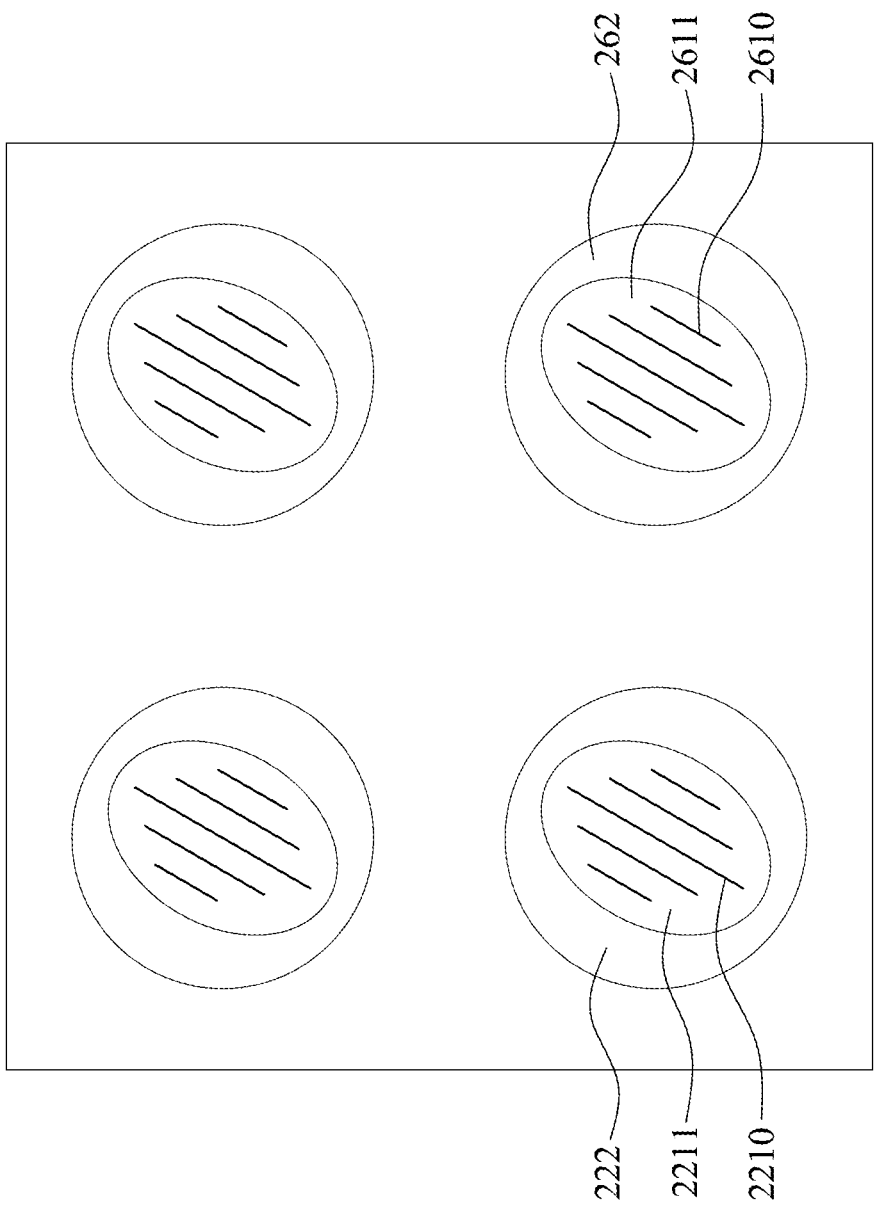
FIG. 2C illustrates a cross-sectional view along line A-A in FIG. 2B.

FIG. 2C illustrates a cross-sectional view along line A-A in FIG. 2B. Referring to FIG. 2C, the surface 2211 of the metal core 221 of the electrical connection 22 may have a substantially oval-shaped profile, and the surface 2611 of the metal core 261 of the electrical connection 26 may have a substantially oval-shaped profile. In some embodiments of the present disclosure, the oval-shaped profile of the surface 2211 of the metal core 221 is substantially identical to the oval-shaped profile of the surface 2611 of the metal core 261. In some embodiments of the present disclosure, an extension direction of a major axis of the oval-shaped profile of the surface 2211 of the metal core 221 of the electrical connection 22 is substantially identical to an extension direction of a major axis of the oval-shaped profile of the surface 2611 of the metal core 261 of the electrical connection 26. Further, the surface 2211 of the metal core 221 may have a number of scratch marks 2210, and the surface 2611 of the metal core 261 may have a number of scratch marks 2610. In some embodiments of the present disclosure, an extension direction of the scratch mark 2210 on the surface 2211 of the metal core 221 and an extension direction of the scratch mark 2610 on the surface 2611 of the metal core 261 are substantially the same.

FIG. 3A, FIG. 3B, FIG. 3C, FIG. 3D, FIG. 3E, FIG. 3F, FIG. 3G, FIG. 3H, FIG. 3I, FIG. 3J and FIG. 3K, illustrate a method of manufacturing a semiconductor device package in accordance with another embodiment of the instant disclosure.

Figure 3A:
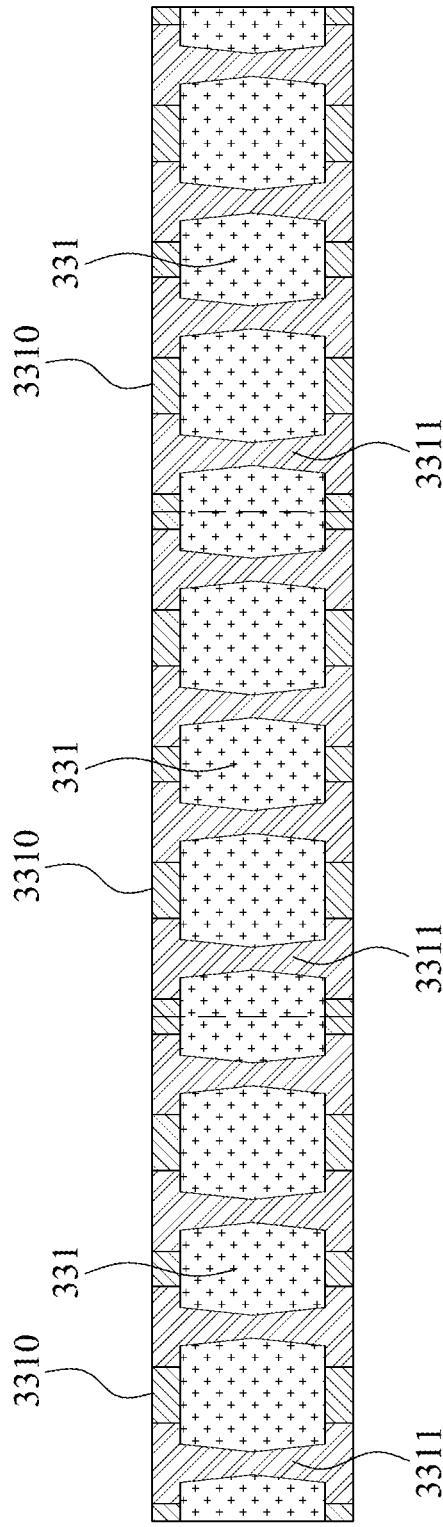
FIG. 3A, FIG. 3B, FIG. 3C, FIG. 3D, FIG. 3E, FIG. 3F, FIG. 3G, FIG. 3H, FIG. 3I, FIG. 3J and FIG. 3K, illustrate a method of manufacturing a semiconductor device package in accordance with another embodiment of the instant disclosure.

Referring to FIG. 3A, a strip, panel or matrix of substrates 331 is provided. Each of substrate 331 includes a number of conductive vias 3311.

Figure 3B:
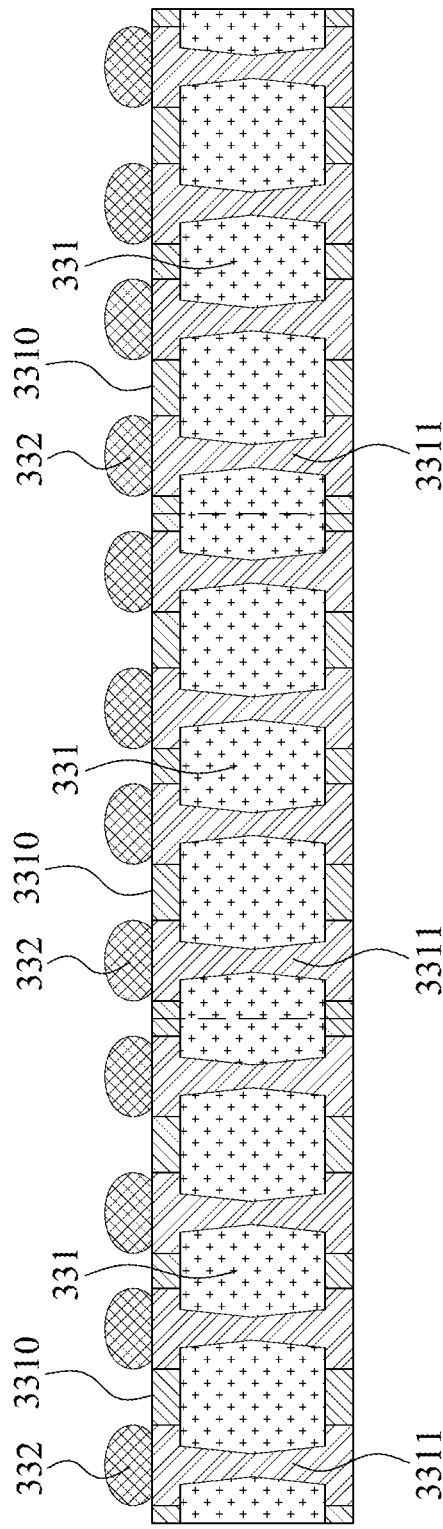

Referring to FIG. 3B, a number of electrical connections 332 are disposed or mounted on surfaces 3310 of the substrates 331. In some embodiments of the present disclosure, the electrical connection 332 includes solder material. The electrical connection 332 may include a solder ball. The electrical connection 332 may substantially align with the conductive via 3311.

Figure 3C:
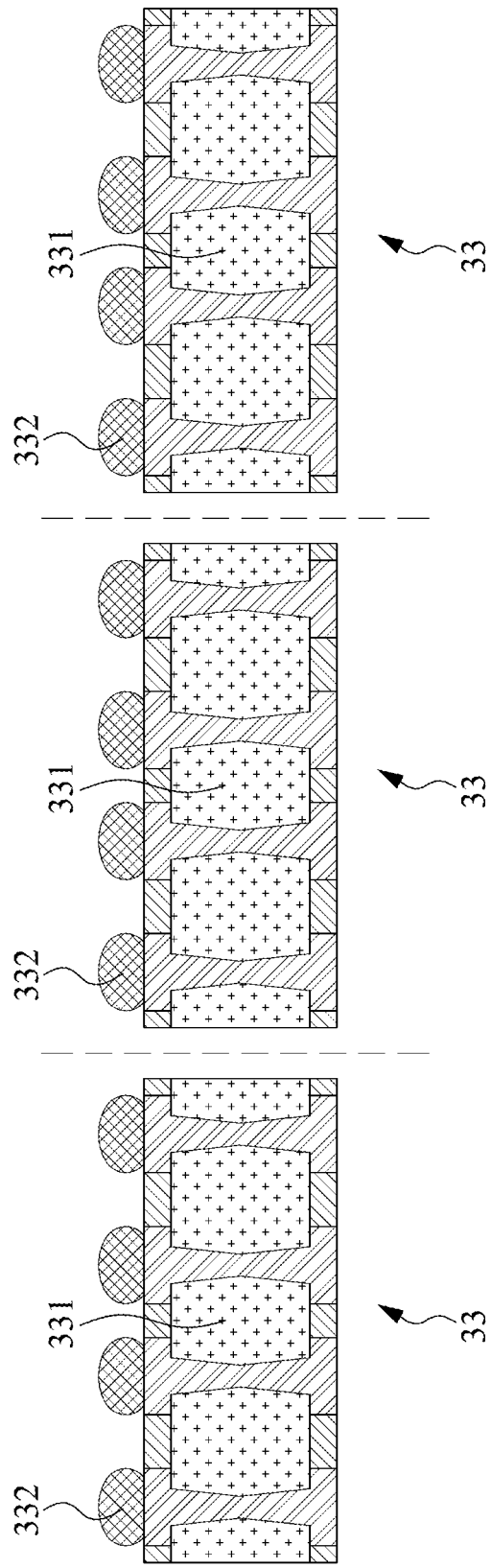

Referring to FIG. 3C, the sub states 331 are separated from each other by a singulation operation, so that the interposer 33 including the substrate 331 and the electrical connections 332 is formed.

Figure 3D:
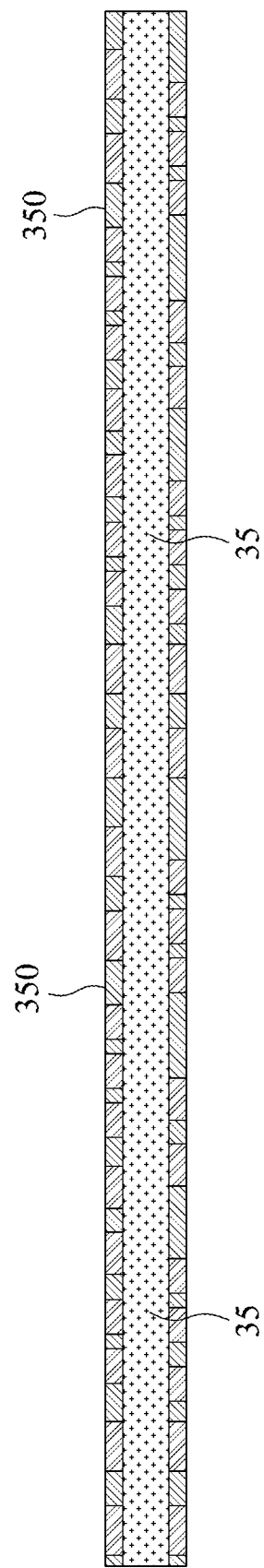

Referring to FIG. 3D, a strip, panel or matrix of subcarriers 35 is provided. Each of the sub-carrier 35 may include traces, pads or interconnections for electrical connection.

Figure 3E:
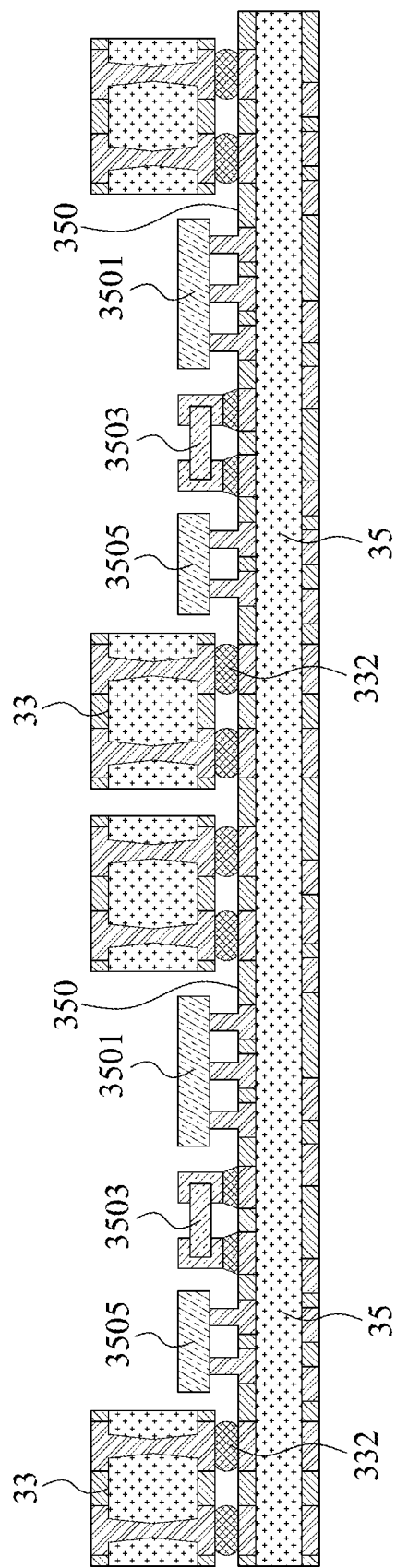

Referring to FIG. 3E, the interposers 33 and electronic components 3501, 3503 and 3505 are disposed or mounted on surfaces 350 of the sub-carriers 35. The electrical connections 332 of the interposers 33 connects the surfaces 350 of the sub-carriers 35, so that the interposers 33 electrically connect the sub-carriers 35 via the electrical connections 332. The electronic component 3501, 3503 and 3505 may be a die, an active device, a passive device, and/or other electronic devices. In some embodiments of the present disclosure, the electronic components 3501, 3503 and 3505 may electrically connect the sub-carrier 35 via electrical connections.

Figure 3F:
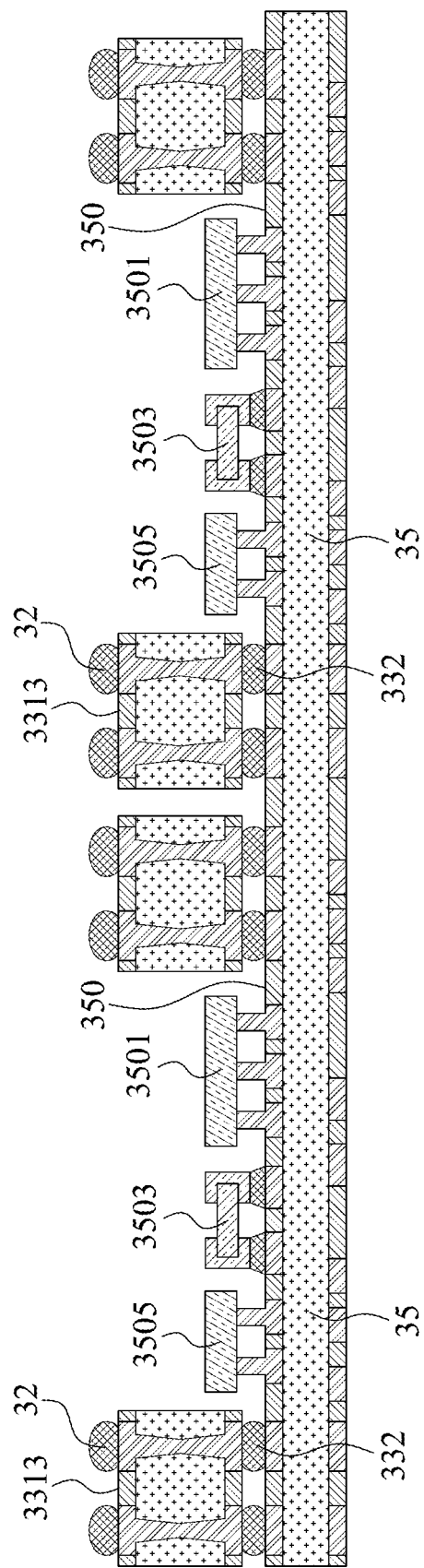

Referring to FIG. 3F, a number of electrical connections 32 are disposed or mounted on surfaces 3313 of the substrates 331 of the interposers 33. In some embodiments of the present disclosure, the electrical connections 32 include solder material. The electrical connections 32 may include solder balls. In some embodiments of the present disclosure, the height of the electrical connection 32 and the interposer 31 is 556 μm, 582.5 μm, 608 μm, etc. In some embodiments of the present disclosure, the height of the sub-carrier 35 is 251 μm, 266 μm, 279 μm, etc. Thus, the total thickness variation (TTV) of the electrical connection 32, the interposer 31 and the sub-carrier 35 may be greater than 10 μm.

Figure 3G:
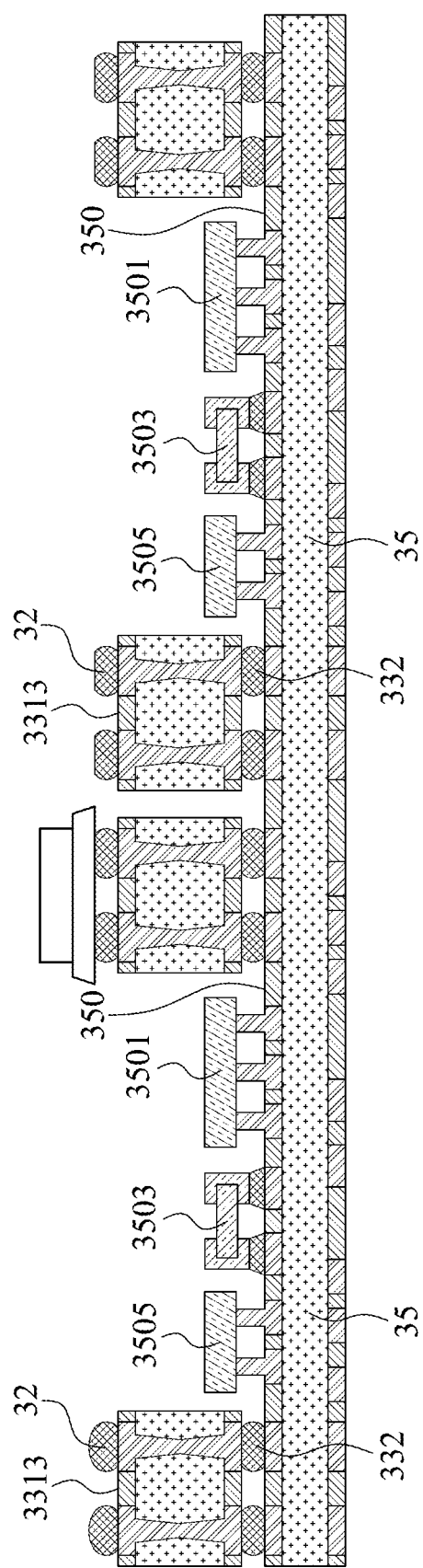

Referring to FIG. 3G, portions of the electrical connections 32 are removed by, for example, a grinding operation, so that the electrical connection 32 could be planarized. As shown in FIG. 3G, the portions of the electrical connections 32 may be removed by a tool for performing the grinding operation. After planarizing the electrical connection 32, the total thickness variation (TTV) of the electrical connection 32, the interposer 31 and the sub-carrier 35 may be smaller than 10 μm.

Figure 3H:
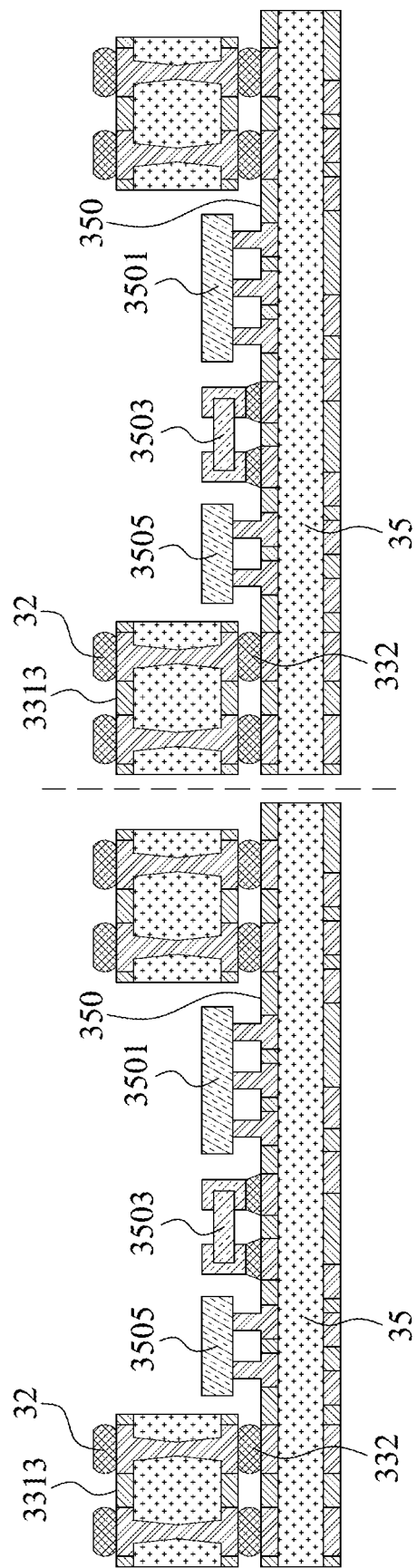

Referring to FIG. 3H, the sub-substrates 35 are separated from each other by a singulation operation.

Figure 3I:
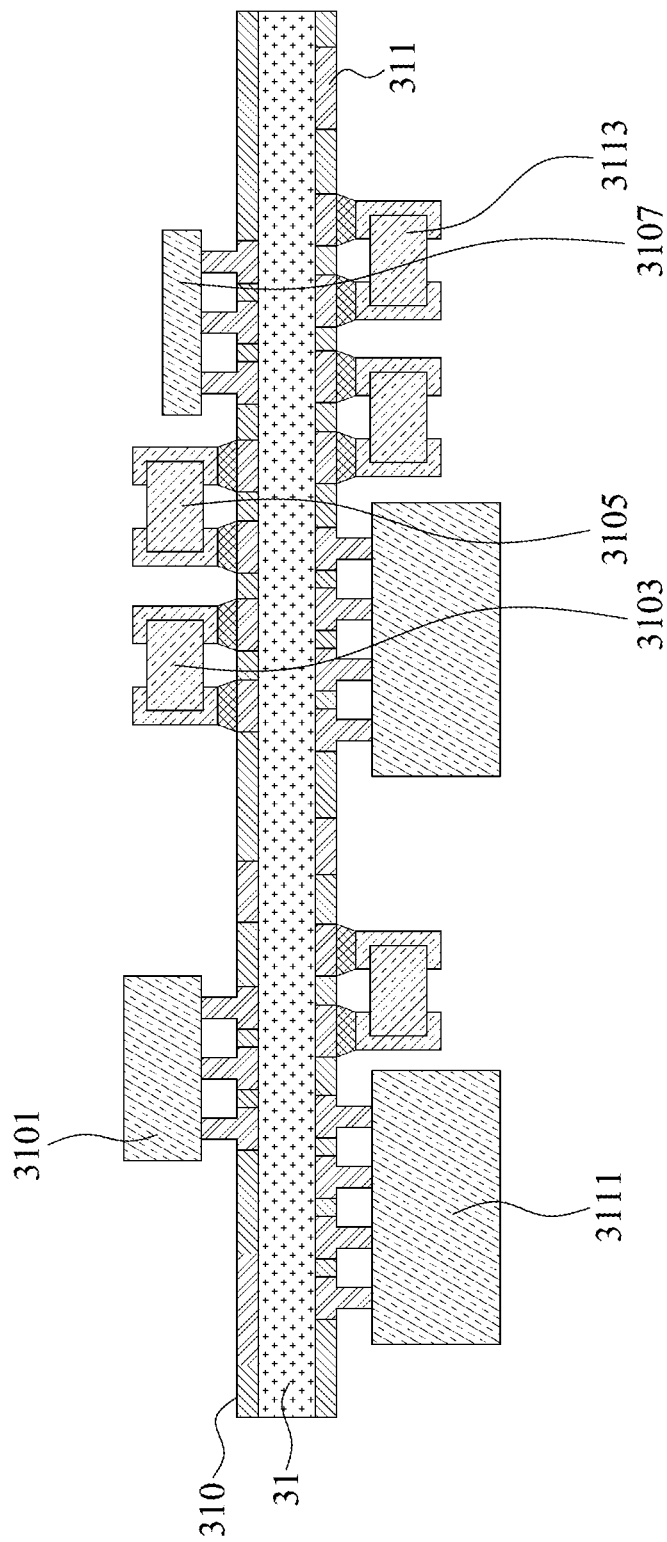

Referring to FIG. 3I, a main carrier 31 is provided. The main carrier 31 may include traces, pads or interconnections for electrical connection. Electronic components 3101, 3013, 3105 and 3107 are disposed or mounted on a surface 310 of the main carrier 31, and electronic components 3111 and 3113 are disposed or mounted on a surface 313 of the main carrier 31. The electronic component 3101, 3103, 3105, 3107, 3111 and 3113 may be a die, an active device, a passive device, and/or other electronic devices. In some embodiments of the present disclosure, the electronic components 3101, 3103, 3105, 3107, 3111 and 3113 may electrically connect the main carrier 31 via electrical connections.

Figure 3J:
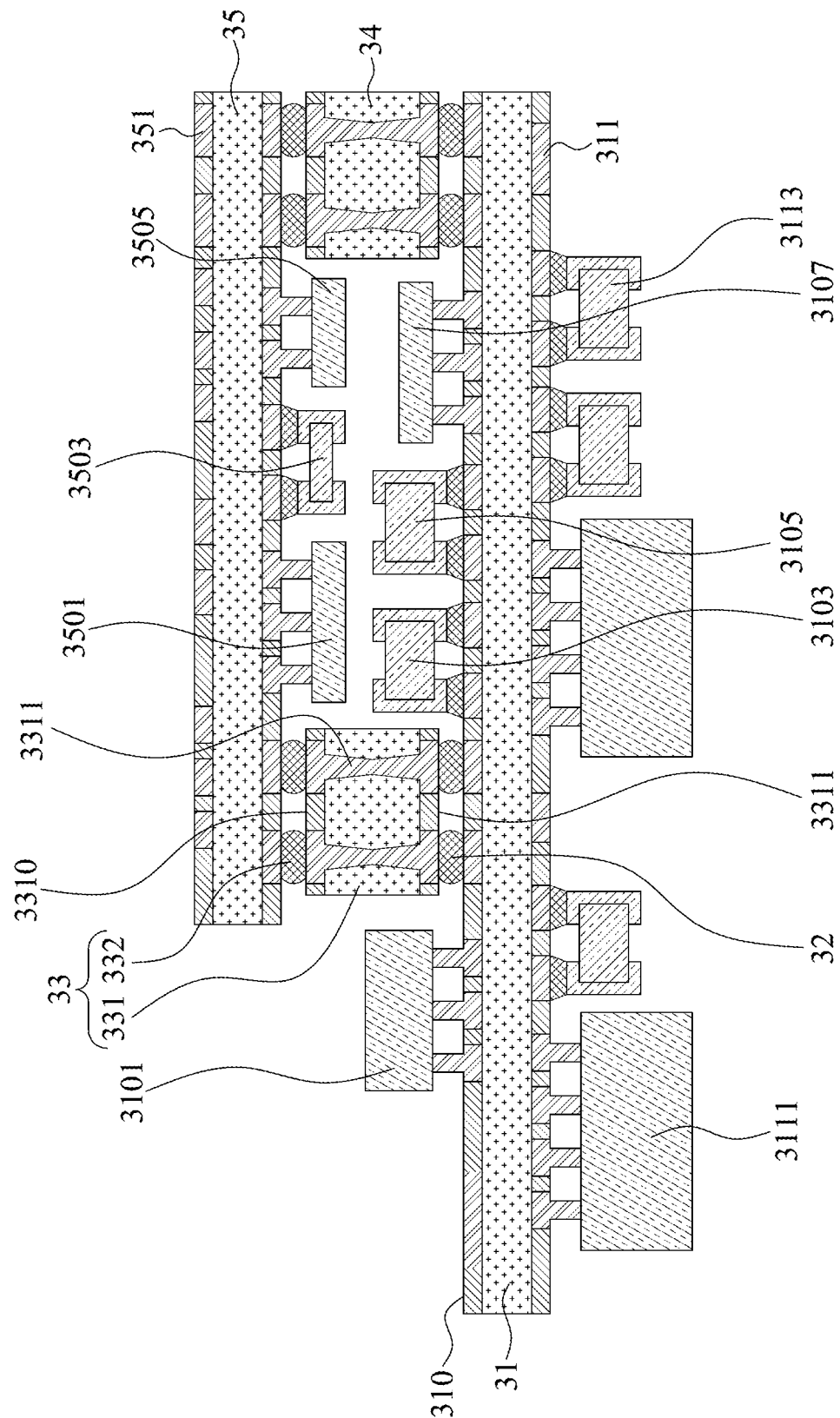

Referring to FIG. 3J, the sub-carrier 35 with the interposers 33, the electronic components 3501, 3503 and 3505 and the electrical connections 32 are disposed on the surface 310 of the main carrier 31. As shown in FIG. 3J, the interposer 33 may be mounted on the surface 310 of the main carrier 31 via the electrical connections 32, so that the sub-carrier 35 may electrically connect the main carrier 31 via the interposer 31 and the electrical connections 32. In some embodiments of the present disclosure, a flux is dipped on the electrical connections 32 when the sub-carrier 35 with the interposers 33, the electronic components 3501, 3503 and 3505 and the electrical connections 32 are mounted on the surface 310 of the main carrier 31. That is, the electrical connections 32 are mounted on the surface 310 of the main carrier 31 by a flux dipping process.

Figure 3K:
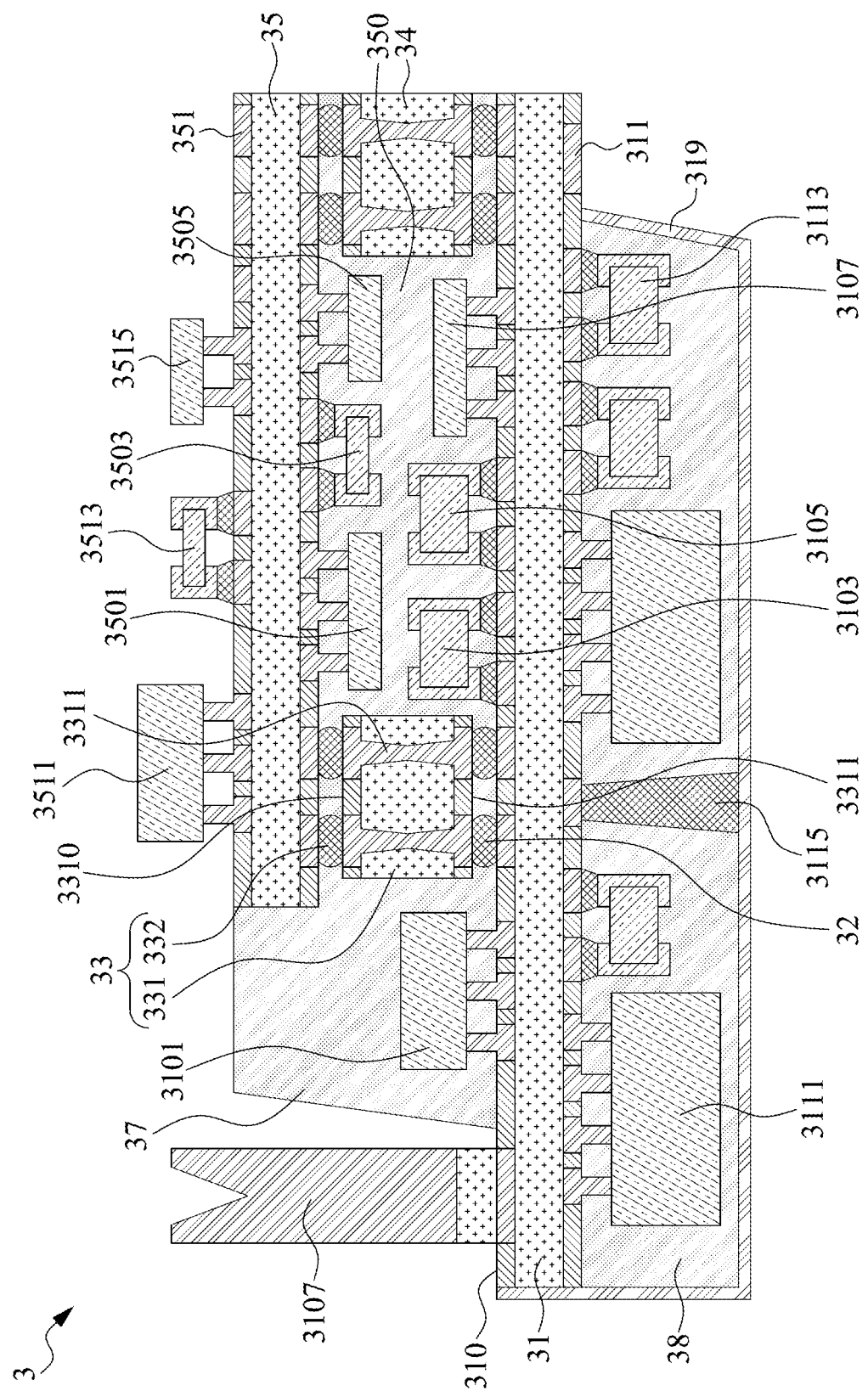

Referring to FIG. 3K, an encapsulant 37 is formed on the surface 310 of the main carrier 31 and an encapsulant 38 is formed on the surface 311 of the main carrier. As shown in FIG. 3K, the encapsulant 37 is configured to cover the surface 310 of the main carrier 31, the electrical connections 32, the interposers 31, the surface 350 of the sub-carrier and the electronic components 3101, 3013, 3105, 3501, 35053 and 3505. A portion of the surface of the surface 310 of the main carrier 31, and a connector 3107 is disposed or mounted on the portion of the surface 310 of the main carrier 31. Further, electronic components 3511, 3513, 3515 are disposed or mounted on a surface 351 of the sub-carrier 35. The electronic component 3511, 3513, 3515 may be a die, an active device, a passive device, and/or other electronic devices. In some embodiments of the present disclosure, the electronic components 3511, 3513, 3515 may electrically connect the sub-carrier 35 via electrical connections. The encapsulant 38 is configured to cover the surface 311 of the main carrier and the electronic components 3111 and 3113. Further, a shield layer 319 is formed on the encapsulant 38, and a conductive via 3115 is formed in the encapsulant 38 and connect the surface 311 of the main carrier 31 and the shield layer 319.

After the manufacturing process as shown in FIG. 3A, FIG. 3B, FIG. 3C, FIG. 3D, FIG. 3E, FIG. 3F, FIG. 3G, FIG. 3H, FIG. 3I, FIG. 3J and FIG. 3K, the semiconductor device package 3 is formed (see FIG. 3K). In some embodiments of the present disclosure, the semiconductor device package 3 is the same as, or similar to, the semiconductor device package 1 shown in FIG. 1.

FIG. 4A, FIG. 4B, FIG. 4C, FIG. 4D, FIG. 4E, FIG. 4F, FIG. 4G, FIG. 4H, FIG. 4I, FIG. 4J. FIG. 4K and FIG. 4L, illustrate a method of manufacturing a semiconductor device package in accordance with another embodiment of the instant disclosure.

Figure 4A:
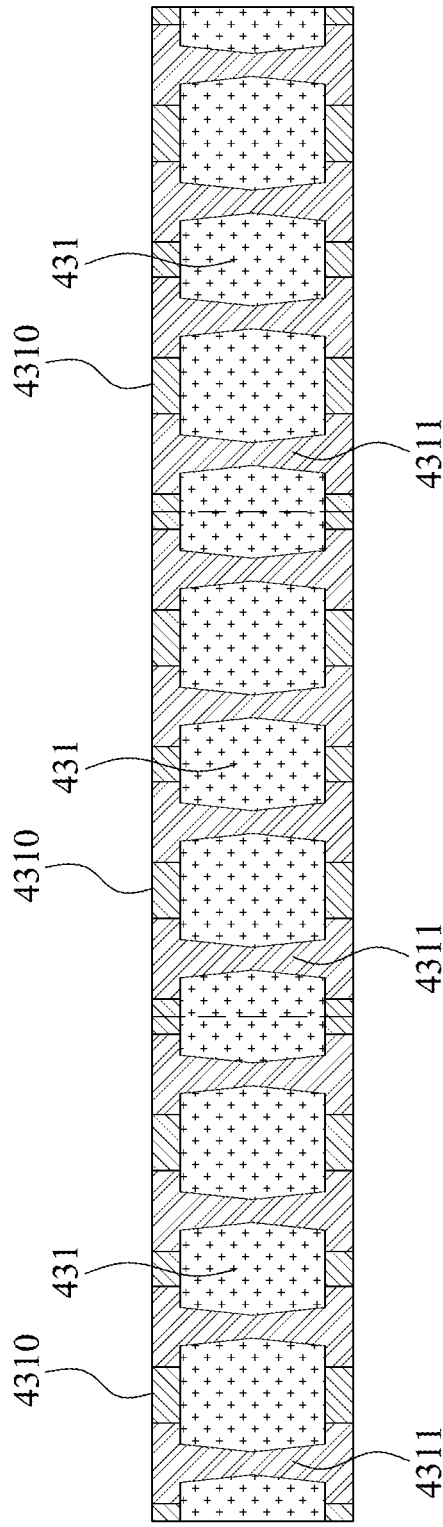
FIG. 4A, FIG. 4B, FIG. 4C, FIG. 4D, FIG. 4E, FIG. 4F, FIG. 4G, FIG. 4H, FIG. 4I, FIG. 4J.

Referring to FIG. 4A, a strip, panel or matrix of substrates 431 is provided. Each of substrate 431 includes a number of conductive vias 4311.

Figure 4B:
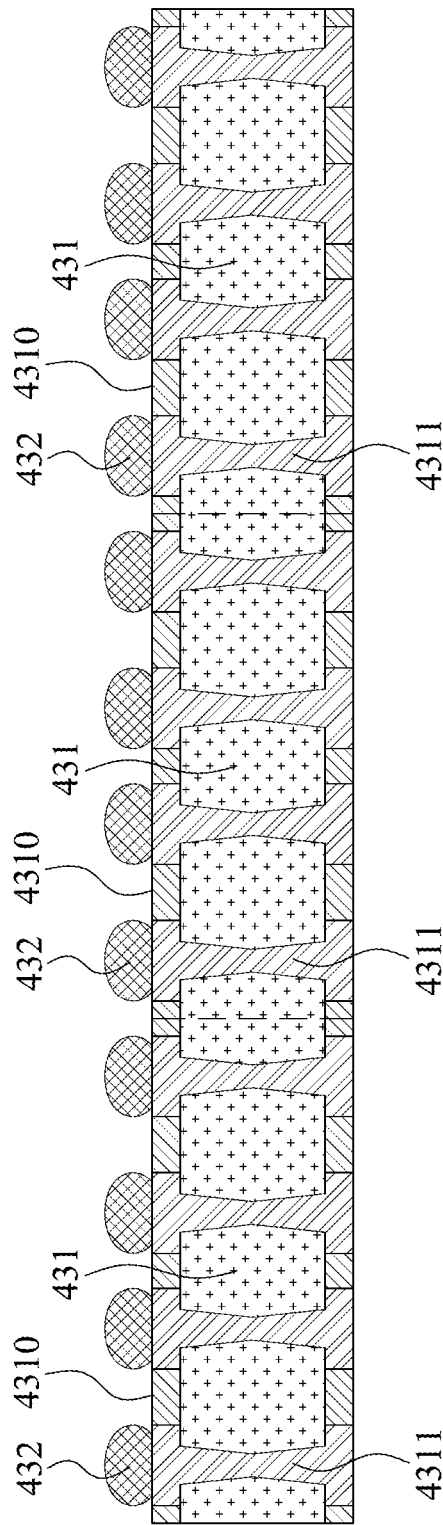

Referring to FIG. 4B, a number of electrical connections 432 are disposed or mounted on surfaces 4310 of the substrates 431. In some embodiments of the present disclosure, the electrical connection 432 includes solder material. The electrical connection 432 may include a solder ball. The electrical connection 432 may substantially align with the conductive via 4311.

Figure 4C:
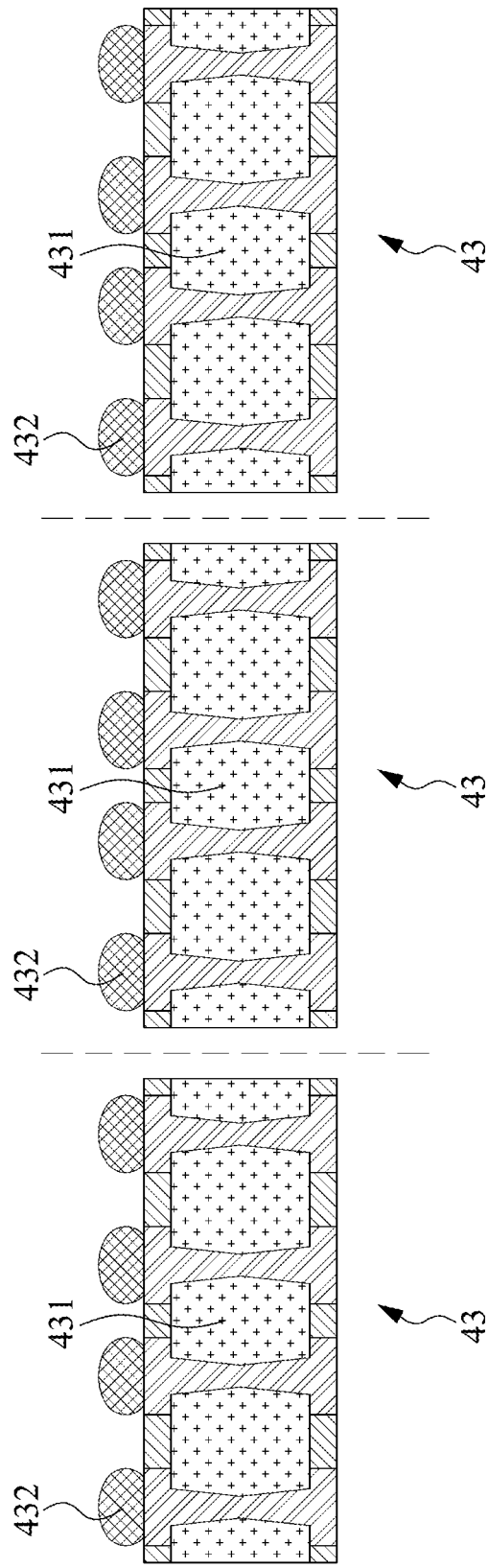

Referring to FIG. 4C, the sub states 431 are separated from each other by a singulation operation, so that the interposer 43 including the substrate 431 and the electrical connections 432 is formed.

Figure 4D:
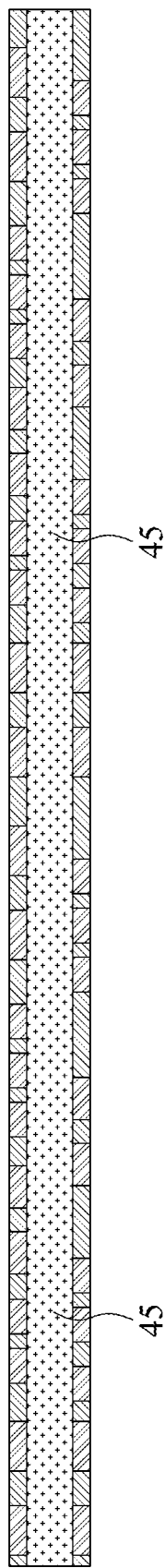

Referring to FIG. 4D, a strip, panel or matrix of sub-carriers 45 is provided. Each of the sub-carrier 45 may include traces, pads or interconnections for electrical connection.

Figure 4E:
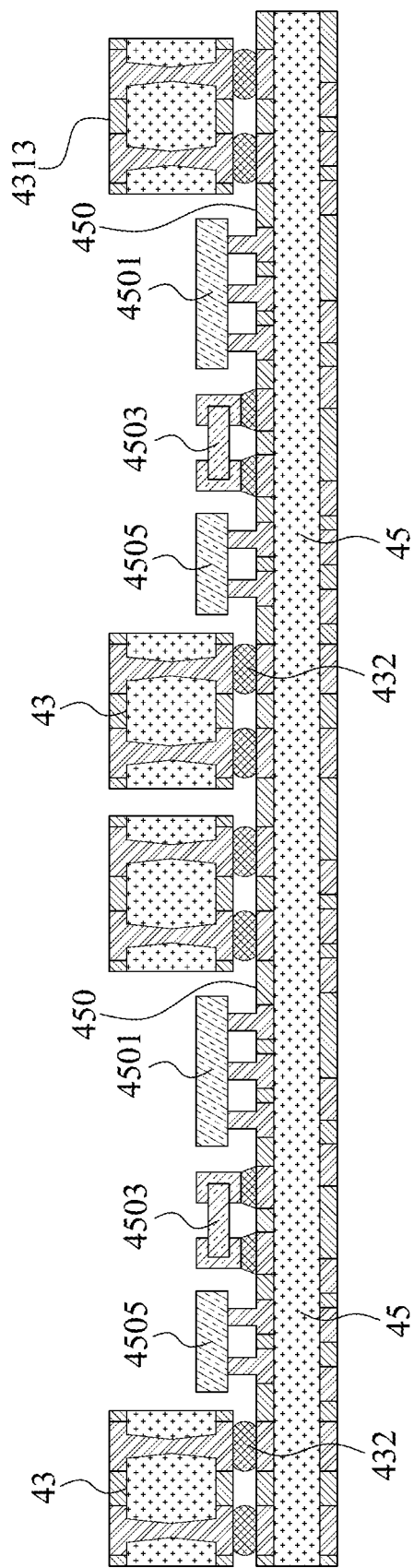

Referring to FIG. 4E, the interposers 33 and electronic components 4501, 4503 and 4505 are disposed or mounted on surfaces 450 of the sub-carriers 45. The electrical connections 432 of the interposers 43 connects the surfaces 450 of the sub-carriers 45, so that the interposers 43 electrically connect the sub-carriers 45 via the electrical connections 332. The electronic component 4501, 4503 and 4505 may be a die, an active device, a passive device, and/or other electronic devices. In some embodiments of the present disclosure, the electronic components 4501, 4503 and 4505 may electrically connect the sub-carrier 45 via electrical connections.

Figure 4F:
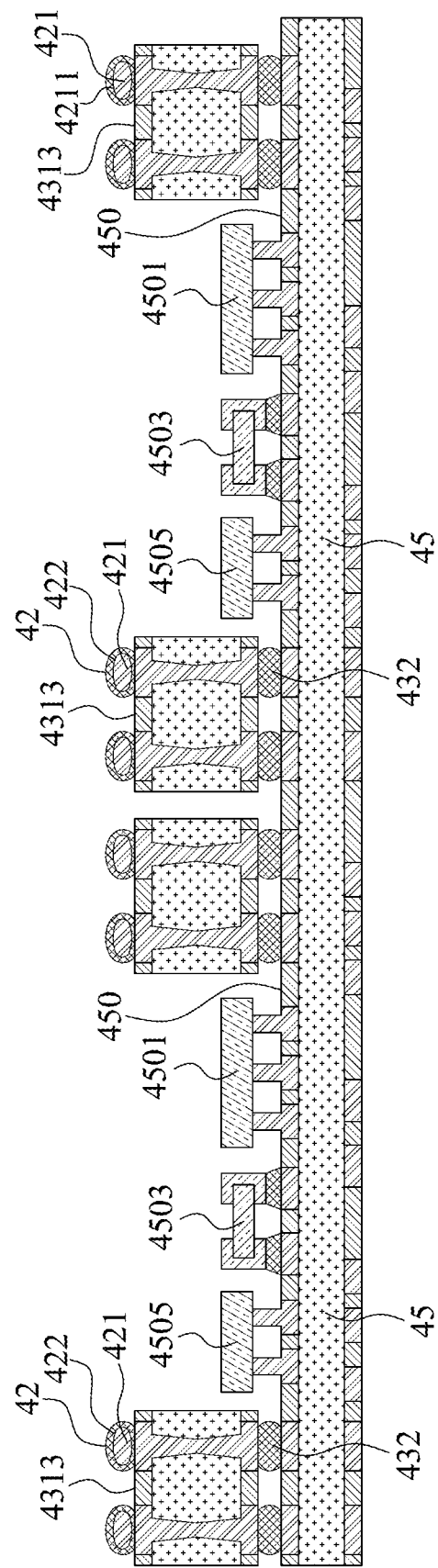

Referring to FIG. 4F, a number of electrical connections 42 are disposed or mounted on surfaces 4313 of the substrates 431 of the interposers 43. In some embodiments of the present disclosure, the electrical connection 42 may be a metal core ball which includes a metal core 421 and solder material 422 surrounding the metal core 421. In some embodiments of the present disclosure, the metal core 421 of the electrical connection 42 is a Cu core. In some embodiments of the present disclosure, the height of the electrical connection 42 and the interposer 41 is 556 μm, 582.5 μm, 608 μm, etc. In some embodiments of the present disclosure, the height of the sub-carrier 45 is 251 μm, 266 μm, 279 μm, etc. Thus, the total thickness variation (TTV) of the electrical connection 42, the interposer 41 and the sub-carrier 45 may be greater than 10 μm.

Figure 4G:
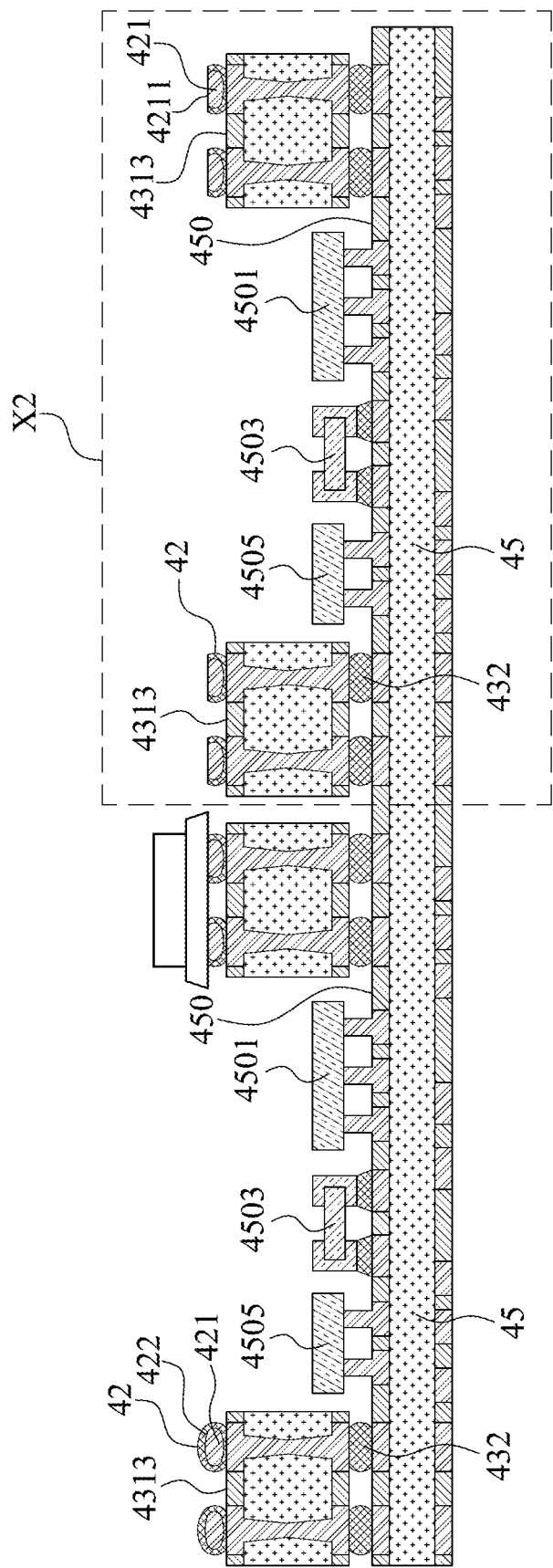

Referring to FIG. 4G, portions of the electrical connections 42 are removed by, for example, a grinding operation, so that the electrical connection 42, the interposer 41 and the sub-carrier 45 could be planarized. As shown in FIG. 4G, the portions of the electrical connections 42 may be removed by a tool for performing the grinding operation. After planarizing the electrical connection 42, the interposer 41 and the sub-carrier 45, the total thickness variation (TTV) of the electrical connection 42, the interposer 41 and the sub-carrier 45 may be smaller than 10 μm.

Figure 4H:
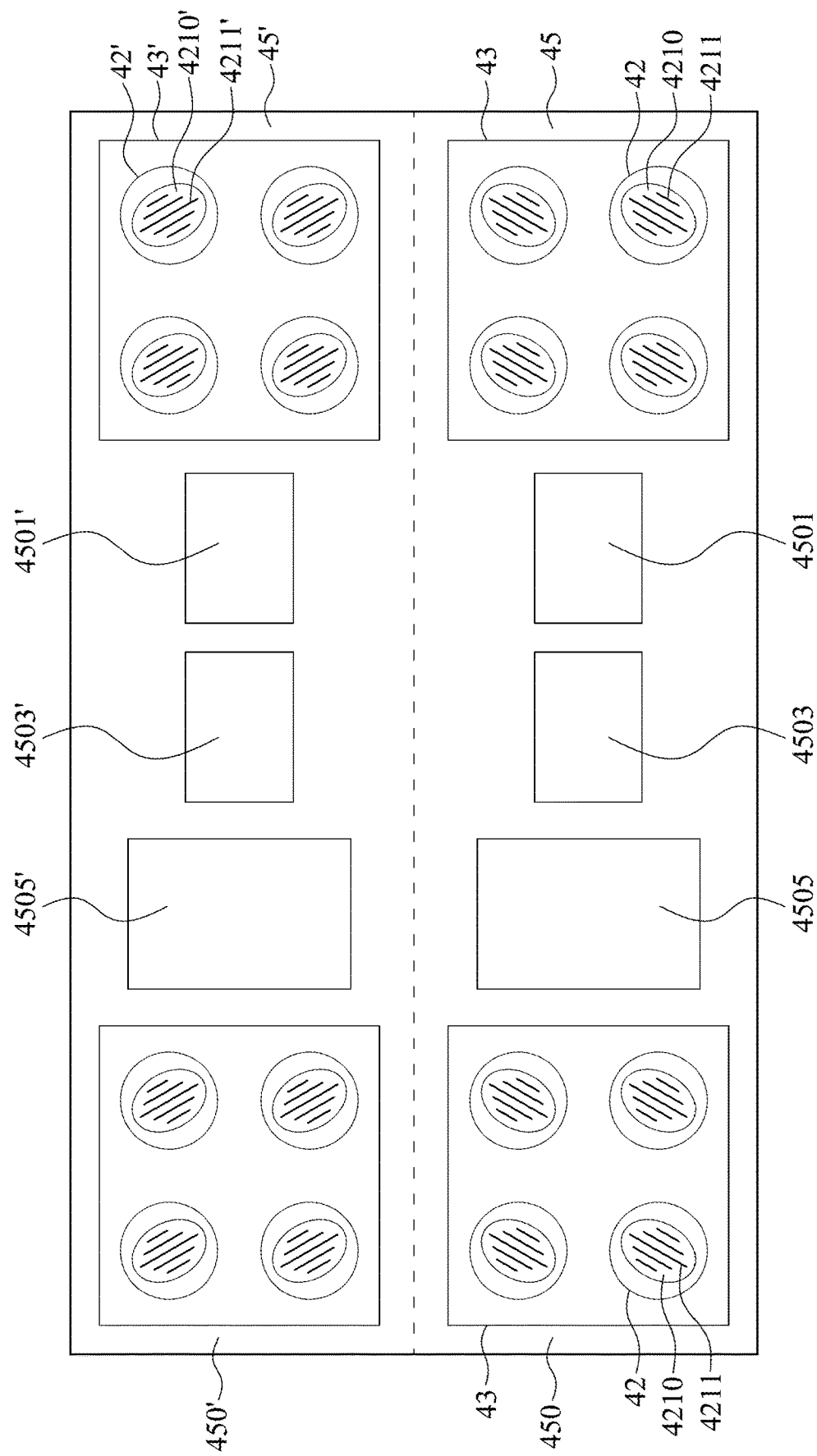

FIG. 4H is an enlarged top view of portion "X2" illustrated in FIG. 4G. FIG. 0.4H shows the sub-carriers 45, 45' with the electrical connections 42. 42' which have been grinded. As shown in FIG. 4H, the sub-carriers 45 and 45' are connected to each other, and the interposers 41 and the electronic components 4501, 4503 and 4505 are disposed on the surface 450 of the sub-carrier 45, and the interposers 41' and the electronic components 4501', 4503' and 4505' are disposed on the surface 450' of the sub-carrier 45'. Referring to FIG. 4H, the electrical connections 42 and 42' have been grinded. When the grinding operation is performed on the electrical connections 42 and 42', the tool for performing the grinding operation may contact and grind the metal cores 421, 421' of the electrical connections 42. Thus, the metal core 421, 421' may have a substantially planar surface 4211, 4211'. The planar surface 4211, 4211' of the metal core 421, 421' may have an oval-shaped profile. In some embodiments of the present disclosure, the oval-shaped profile of the planar surface 4211 of the metal core 421 is different from the oval-shaped profile of the planar surface 4211' of the metal core 421'. In some embodiments of the present disclosure, an extension direction of a major axis of the oval-shaped profile of the planar surface 4211 of the metal core 421 of the electrical connection 42 is different from an extension direction of a major axis of the oval-shaped profile of the planar surface 4211' of the metal core 421' of the electrical connection 42'. Moreover, the electrical connection 42 may include a number of scratch marks 4210 formed on the planar surface 4211 of the metal core 421, and the electrical connection 42' may include a number of scratch marks 4210' formed on the planar surface 4211' of the metal core 421'. In some embodiments of the present discourse, an extension direction of the scratch mark 4210 on the planar surface 4211 of the metal core 421 is different from an extension direction of the scratch mark 4210' on the planar surface 4211' of the metal core 421'.

Figure 4I:
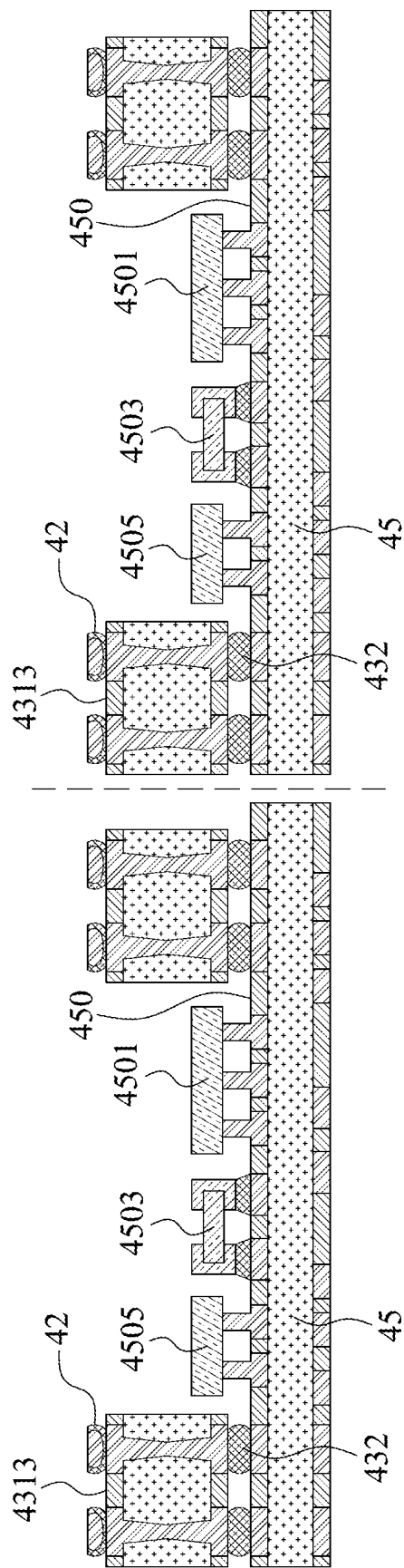

Referring to FIG. 4I, the sub-substrates 45 are separated from each other by a singulation operation.

Figure 4J:
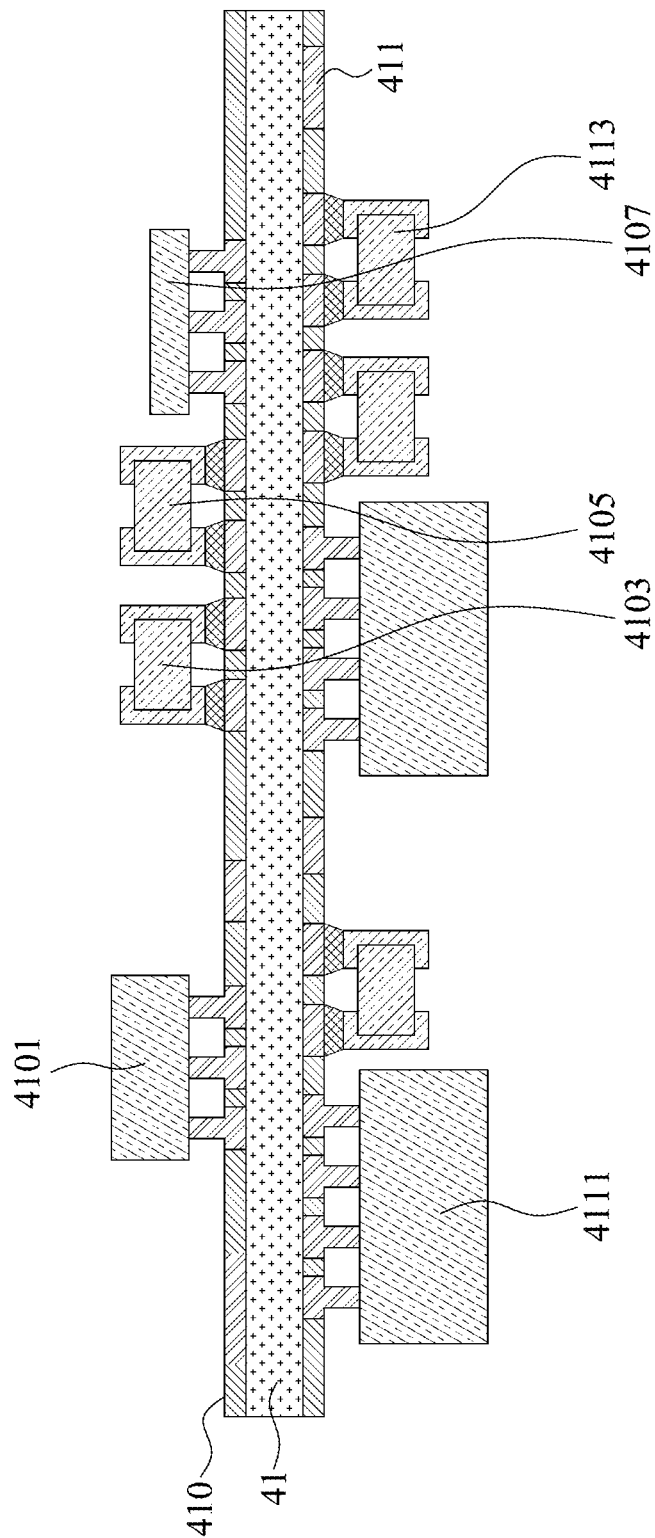
Figure 4K:
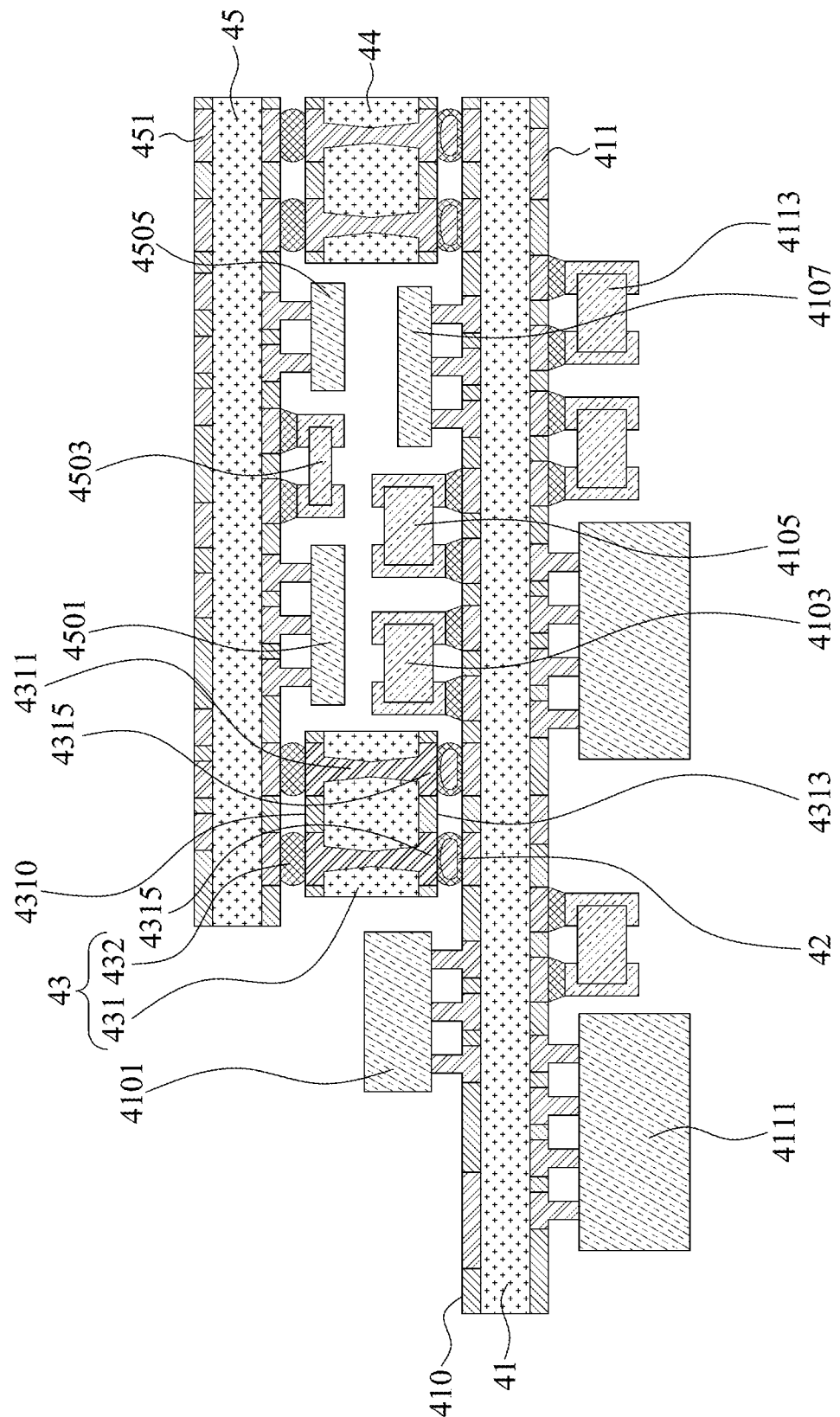
FIG. 4K and FIG. 4L, illustrate a method of manufacturing a semiconductor device package in accordance with another embodiment of the instant disclosure.
Figure 4L:
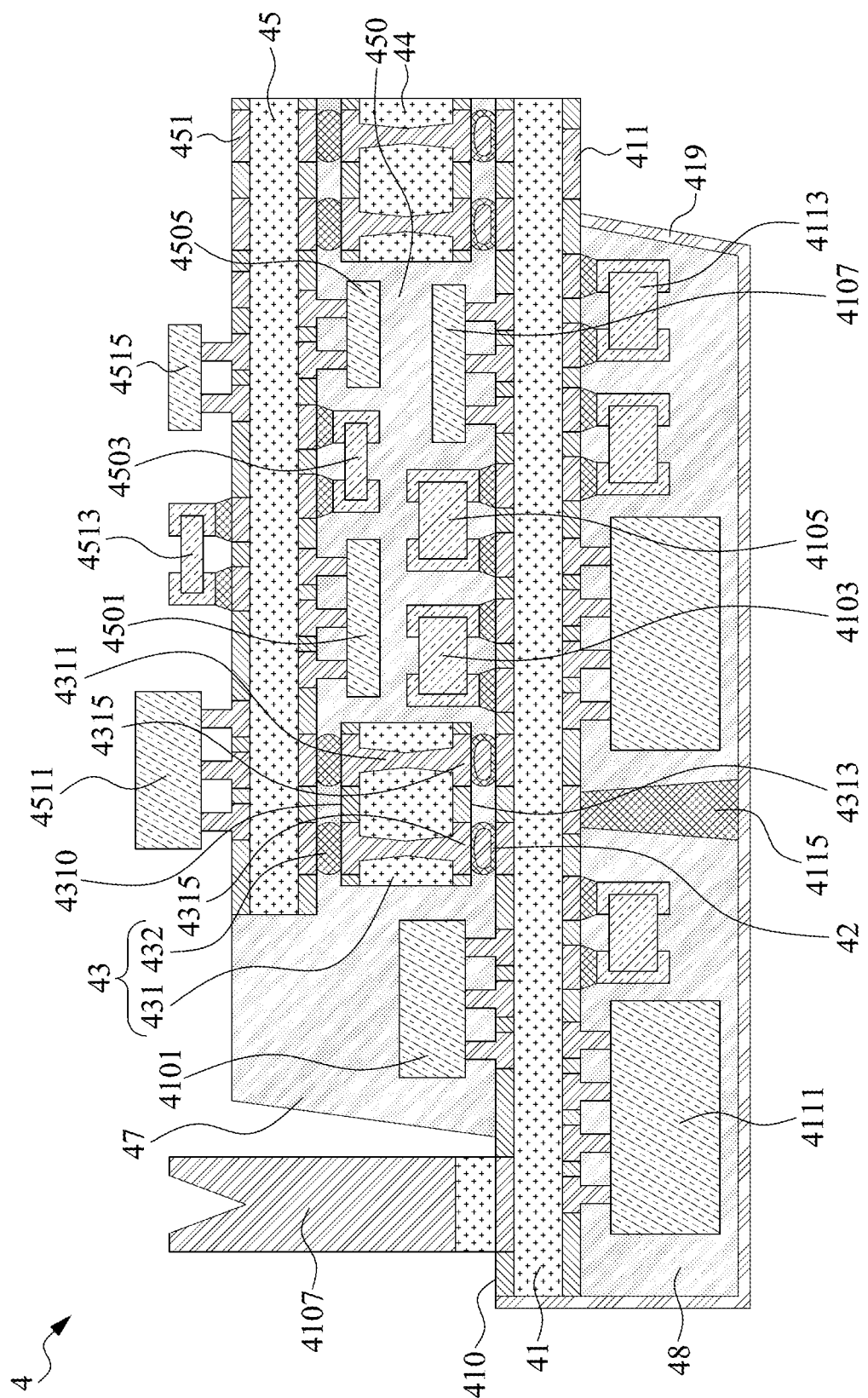

Referring to FIG. 4J, a main carrier 41 is provided. The main carrier 41 may include traces, pads or interconnections for electrical connection. Electronic components 4101, 4013, 4105 and 4107 are disposed or mounted on a surface 310 of the main carrier 41, and electronic components 4111 and 4113 are disposed or mounted on a surface 413 of the main carrier 41. The electronic component 4101, 4103, 4105, 4107, 4111 and 4113 may be a die, an active device, a passive device, and/or other electronic devices. In some embodiments of the present disclosure, the electronic components 4101, 4103, 4105, 4107, 4111 and 4113 may electrically connect the main carrier 31 via electrical connections.

Referring to 4K, the sub-carrier 45 with the interposers 43, the electronic components 4501, 4503 and 4505 and the electrical connections 42 are disposed on the surface 410 of the main carrier 41. As shown in FIG. 4K, the interposer 43 may be mounted on the surface 410 of the main carrier 41 via the electrical connections 42, so that the sub-carrier 45 may electrically connect the main carrier 41 via the interposer 41 and the electrical connections 42. In some embodiments of the present disclosure, the electrical connections 42 are mounted on the surface 410 of the main carrier 41 by a flux dipping process.

Referring to FIG. 4L, an encapsulant 47 is formed on the surface 410 of the main carrier 41 and an encapsulant 48 is formed on the surface 411 of the main carrier. As shown in FIG. 4L, the encapsulant 47 is configured to cover the surface 410 of the main carrier 41, the electrical connections 42, the interposers 41, the surface 450 of the sub-carrier 45 and the electronic components 4101, 4013, 4105, 4501, 45053 and 4505. A portion of the surface of the surface 410 of the main carrier 41, and a connector 4107 is disposed or mounted on the portion of the surface 410 of the main carrier 31. Further, electronic components 4511, 4513, 4515 are disposed or mounted on a surface 451 of the sub-carrier 45. The electronic component 4511, 4513, 4515 may be a die, an active device, a passive device, and/or other electronic devices. In some embodiments of the present disclosure, the electronic components 4511, 4513, 4515 may electrically connect the sub-carrier 45 via electrical connections. The encapsulant 48 is configured to cover the surface 411 of the main carrier and the electronic components 4111 and 4113. Further, a shield layer 419 is formed on the encapsulant 48, and a conductive via 4115 is formed in the encapsulant 48 and connect the surface 411 of the main carrier 41 and the shield layer 419.

After the manufacturing process as shown in FIG. 4A, FIG. 4B, FIG. 4C, FIG. 4D, FIG. 4E, FIG. 4F, FIG. 4G, FIG. 4H, FIG. 4I, FIG. 4J. FIG. 4K and FIG. 4L, the semiconductor device package 4 is formed (see FIG. 4L). In some embodiments of the present disclosure, the semiconductor device package 4 is the same as, or similar to, the semiconductor device package 2 shown in FIG. 2A.

Figure 5A:
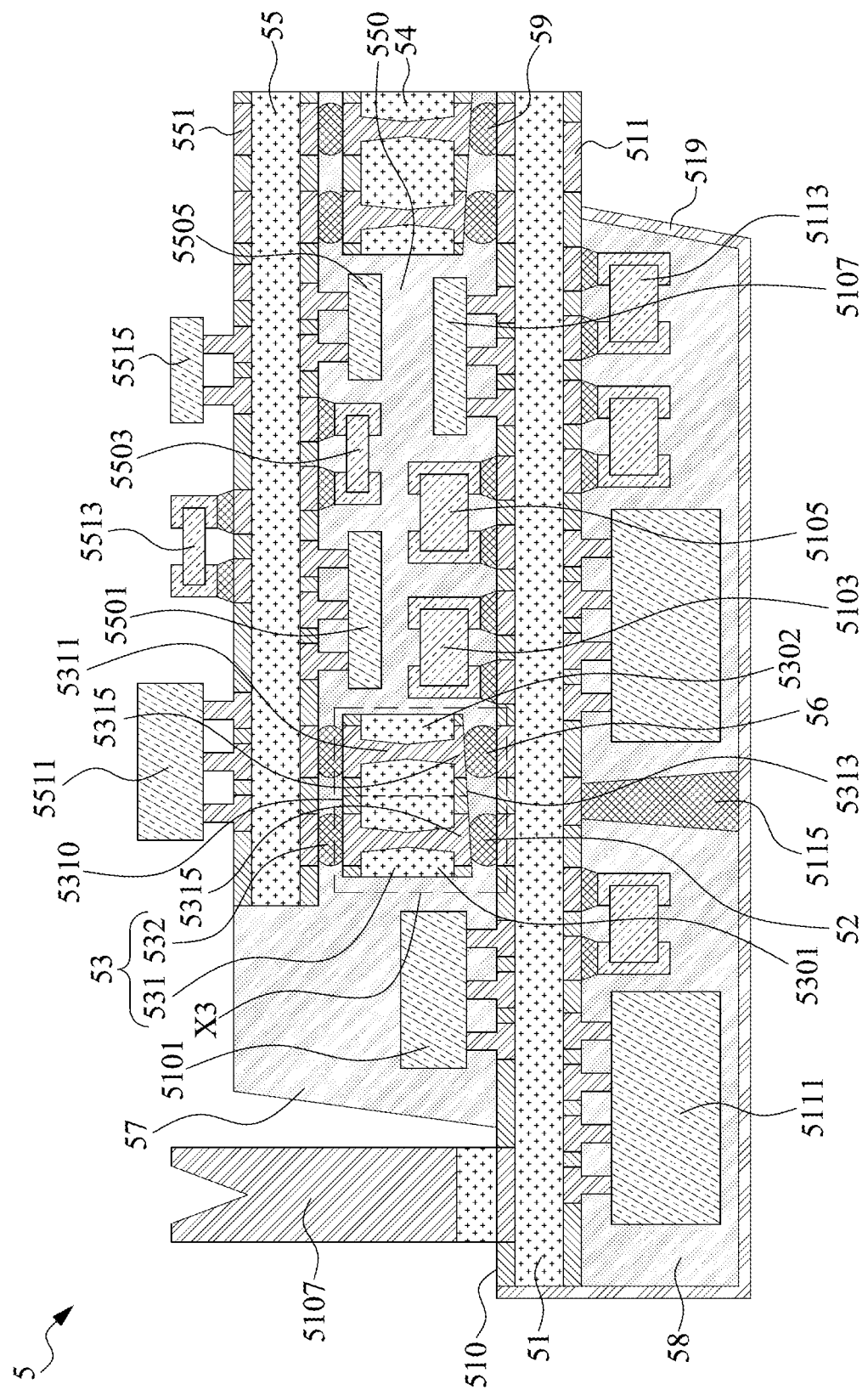
FIG. 5A is a cross-sectional view of a semiconductor device package in accordance with an embodiment of the instant disclosure.

FIG. 5A is a cross-sectional view of a semiconductor device package 5 in accordance with some embodiments of the present disclosure. As shown in FIG. 5A, the semiconductor device package 5 includes a main carrier 51, an interposer 53 and a sub-carrier 55. In some embodiments, the main carrier 51 includes a substrate, which may be a core substrate or a core-less substrate and may include traces, pads or interconnections for electrical connection. Referring to FIG. 5A, the main carrier 51 has a surface 510 (e.g., an upper surface) and a surface 511 (e.g., a lower surface), and electronic components 5101, 5103, 5105 and 5107 may be disposed or mounted on the surface 510 of the main carrier 51 and electronic components 5111 and 5113 may be disposed or mounted on the surface 511 of the main carrier 51. The electronic component 5101, 5103, 5105, 5107, 5111 and 5113 may be a die, an active device, a passive device, and/or other electronic devices. In some embodiments of the present disclosure, the electronic components 5101, 5103, 5105, 5107, 5111 and 5113 may electrically connect the main carrier 51 via electrical connections.

As shown in FIG. 5A, the interposer 53 is disposed or mounted on the surface 510 of the main carrier 51. The interposer 53 may include a substrate 531 and electrical connections 532. The substrate 531 may include conductive vias 5311. In some embodiments of the present disclosure, the conductive via 5311 is a through silicon via (TSV). Further, the substrate 531 includes a surface 5310 (e.g., an upper surface) and the electrical connections 532 are disposed on the surface 5310 of the substrate 531. In some embodiments of the present disclosure, the electrical connection 532 includes solder material. The electrical connection 532 may include a solder ball. Referring to FIG. 5A, the interposer 53 electrically connects to the main carrier 51 via electrical connections 52 and 56. That is, the electrical connections 52 and 56 are arranged between the surface 510 of the main carrier 51 and a surface 5313 (e.g., a lower surface) of the substrate 531 of the interposer 53. The substrate 531 of the interposer 53 may include electrodes 5315 at the surface 5313, and the electrical connections 52 and 56 may be connected to the electrodes 5315 of the substrate 531 of the interposer 53. In some embodiments of the present disclosure, the electrode 5315 includes a pad. In some embodiments of the present disclosure, the electrical connections 52 and 56 include solder material used for soldering with the electrodes 5315 of the interposer 53. The electrical connections 52 and 56 may include solder balls. In some embodiments of the present disclosure, a volume of the electrical connection 52 and a volume of the electrical connection 56 are different from each other. In some embodiments of the present disclosure, a volume of the solder material of the electrical connection 52 is different from a volume of the solder material of the electrical connection 56. In some embodiments of the present disclosure, a volume of the electrical connection 532 is greater than the volume of the electrical connection 52. In some embodiments of the present disclosure, a volume of the electrical connection 532 is greater than the volume of the electrical connection 56. In some embodiments of the present disclosure, a volume of the solder material the electrical connection 532 is greater than the volume the solder material of the electrical connection 52. In some embodiments of the present disclosure, a volume of the solder material the electrical connection 532 is greater than the volume the solder material of the electrical connection 56. In some embodiments of the present disclosure, a thickness of the electrical connection 532 is greater than a thickness of the electrical connection 52. In some embodiments of the present disclosure, a thickness of the electrical connection 532 is greater than a thickness of the electrical connection 56. In some embodiments of the present disclosure, the electrical connection 52, 56 is the same as, or similar to, the electrical connection 22, 26 as disclosed in FIGS. 2A, 2B and/or 2C, which includes the solder material and the spacer covered by the solder material.

In addition, the substrate 531 of the interposer 53 does not have the uniform thickness, such that the total thickness of the interposer 53 is non-uniform and the surface 5313 of the substrate 53 is not substantially parallel to the surface 510 of the main carrier 51. Referring to FIG. 5A, the substrate 531 has a first portion 5301 and a second portion 5302, and a thickness of the first portion 5301 is substantially greater than a thickness of the second portion 5302. Further, a thickness of the electrical connection 52, which connects the first portion 5301 of the interposer 53 to the main-carrier 51, is smaller than a thickness of the electrical connection 56, which connects the second portion 5302 of the interposer 53 to the main carrier 51.

The sub-carrier 55 is disposed on the interposers 53. In some embodiments, the sub-carrier 55 includes a substrate, which may be a core substrate or a core-less substrate and may include traces, pads or interconnections for electrical connection. Referring to FIG. 5A, the sub-carrier 55 has a surface 550 (e.g., a lower surface) and a surface 551 (e.g., an upper surface), and electronic components 5501, 5503 and 5505 may be disposed or mounted on the surface 550 of the sub-carrier 55 and electronic components 5511, 5513 and 5515 may be disposed or mounted on the surface 551 of the sub-carrier 55. The electronic component 5501, 5503, 5505, 5511, 5513 and 5515 may be a die, an active device, a passive device, and/or other electronic devices. In some embodiments of the present disclosure, the electronic components 5501, 5503, 5505, 5511, 5513 and 5515 may electrically connect the main carrier 55 via electrical connections.

The electrical connections 532 of the interposer 53 is configured to abut and/or connect the surface 550 of the sub-carrier 55. That is, the sub-carrier 55 is electrically connected the interposer 53 via the electrical connections 532.

In some embodiments of the present disclosure, there is another interposer 54 disposed or mounted on the surface 510 of the main carrier 51, and the sub-carrier 55 is disposed on the interposer 54. The interposer 54 is spaced apart from the interposer 53. The interposer 54 may electrically connect to the main carrier 51 via electrical connections 59. In some embodiments of the present disclosure, the electrical connection 59 includes solder material. The electrical connection 59 may include solder balls. In some embodiments of the present disclosure, a volume of the electrical connection 59 and the volume of the electrical connection 52 or 56 are different from each other. In some embodiments of the present disclosure, a volume of the solder material of the electrical connection 59 is different from the volume of the solder material of the electrical connection 52 or 56.

In some embodiments of the present disclosure, a total thickness variation (TTV) of the electrical connections 52, 56, the interposers 53, 54 and the sub-carrier 55 may be less than 10 μm.

Referring to FIG. 5A, an encapsulant 57 (i.e., package body) is disposed on the surface 510 of the main-carrier 51. The encapsulant 57 may cover the surface 510 of the main-carrier 51, the electronic components 5101, 5103, 5105 and 5107 disposed on the surface 510 of the main carrier, the interposers 53 and 54, the electrical connections 52 and 56, the surface 550 of the sub-carrier 55 and the electronic components 5501, 5053 and 5505 disposed on the surface 550 of the sub-carrier 55. The encapsulant 57 may include molding compounds, such as a Novolac-based resin, an epoxy-based resin, a silicone-based resin, or other another suitable encapsulant; fillers such as silicon oxide fillers, may be included in the molding compound. In addition, the encapsulant 57 may include a molding underfill (MUF) or a capillary underfill (CUF). Further, as shown in FIG. 5A, a portion of the surface 510 of the main carrier 51 is not covered by the encapsulant 57, and the electronic component 5107 is disposed or mounted on the portion of the surface 510 of the main-carrier 51. In some embodiments of the present disclosure, the electronic component 5107 includes a connector which is configured to connect the main carrier 51 to an external electronic component.

Moreover, an encapsulant 58 (i.e., package body) is disposed on the surface 511 of the main carrier 51. The encapsulant 58 may cover the surface 511 of the main-carrier 51 and the electronic components 5111 and 5113 disposed on the surface 511 of the main carrier 51. The encapsulant 58 may include molding compounds, such as a Novolac-based resin, an epoxy-based resin, a silicone-based resin, or other another suitable encapsulant; fillers such as silicon oxide fillers, may be included in the molding compound. In addition, the encapsulant 58 may include a molding underfill (MUF) or a capillary underfill (CUF). In some embodiments of the present disclosure, a conductive layer 519 is formed on the encapsulant 18. The conductive layer 519 may be a shielding layer which electrically connects to the main carrier 51 via a conductive via 5115.

Figure 5B:
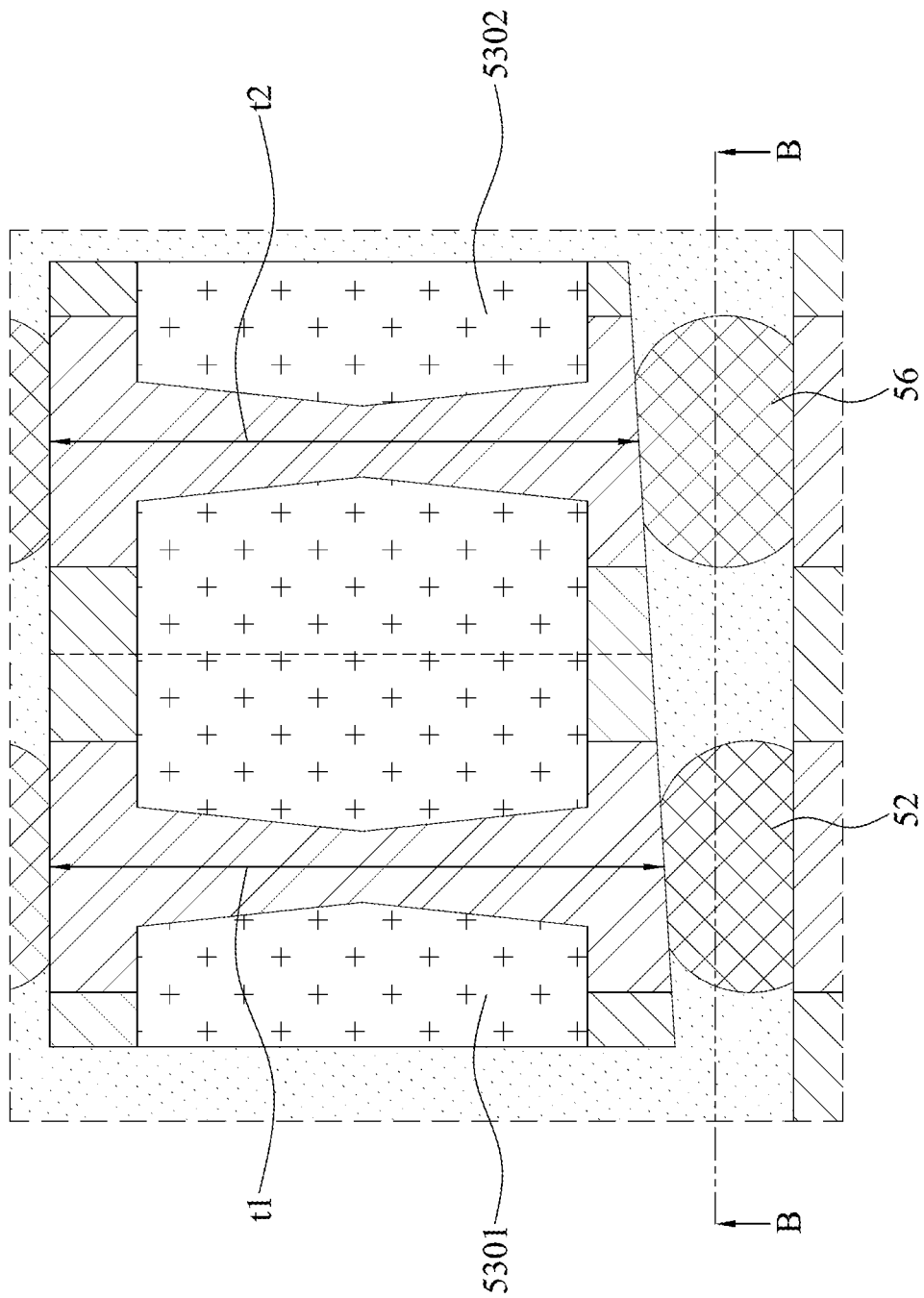
FIG. 5B is an enlarged view of portion "X3" illustrated in FIG. 5A.

FIG. 5B is an enlarged view of portion "X3" illustrated in FIG. 5A. As shown in FIG. 5B, the substrate 531 has a first portion 5301 and a second portion 5302, and the thickness t1 of the first portion 5301 is substantially greater than the thickness t2 of the second portion 5302. That is, a distance between the surface 510 of the main carrier 51 and the first portion 5301 of the interposer 53 is smaller than a distance between the surface 510 of the main carrier 51 and the second portion 5302 of the interposer. Therefore, a distance between the first portion 5301 of the interposer 53 and the main carrier 51 is different from a distance between the second portion 5302 of the interposer 53 and the main carrier 51. Further, the thickness of the electrical connection 52, which connects the first portion 5301 of the interposer 53 to the main-carrier 51, is smaller than the thickness of the electrical connection 56, which connects the second portion 5302 of the interposer 53 to the main carrier 51. Since the thickness of the electrical connection 52 is different from the thickness of the electrical connection 56, the electrical connections 52 and 56 may cooperate to compensate the thickness difference between the first portion 5301 and the second portion 5302 of the interposer 53. Thus, a total thickness of the electrical connection 52 and the first portion 5301 is substantially equal to a total thickness of the electrical connection 56 and the second portion 5302, and a total thickness of the electrical connection 52, the first portion 5301 and the electrical connection 532 is substantially equal to a total thickness of the electrical connection 56, the second portion 5302 and the electrical connection 532. Therefore, the interposer 53, which includes the substrate 531 and the electrical connections 532, is reliably connected to the main carrier 51 through the electrical connections 52 and 56.

In some embodiments of the present disclosure, a thickness of the first portion 5301 is substantially greater than a thickness of the second portion 5302. In this regard, the interposer 53 may be the same as, or similar to the interposer 54 as disclosed in FIG. 5A. That is, a distance between the surface 510 of the main carrier 51 and the first portion 5301 of the interposer 53 is greater than a distance between the surface 510 of the main carrier 51 and the second portion 5302 of the interposer. Therefore, a distance between the first portion 5301 of the interposer 53 and the main carrier 51 is different from a distance between the second portion 5302 of the interposer 53 and the main carrier 51. In this way, a thickness of the electrical connection 52, which connects the first portion 5301 of the interposer 53 to the main-carrier 51, is greater than a thickness of the electrical connection 56, which connects the second portion 5302 of the interposer 53 to the main carrier 51. Likewise, the electrical connections 52 and 56 may cooperate to compensate the thickness difference between the first portion 5301 and the second portion 5302 of the interposer 53.

Figure 5C:
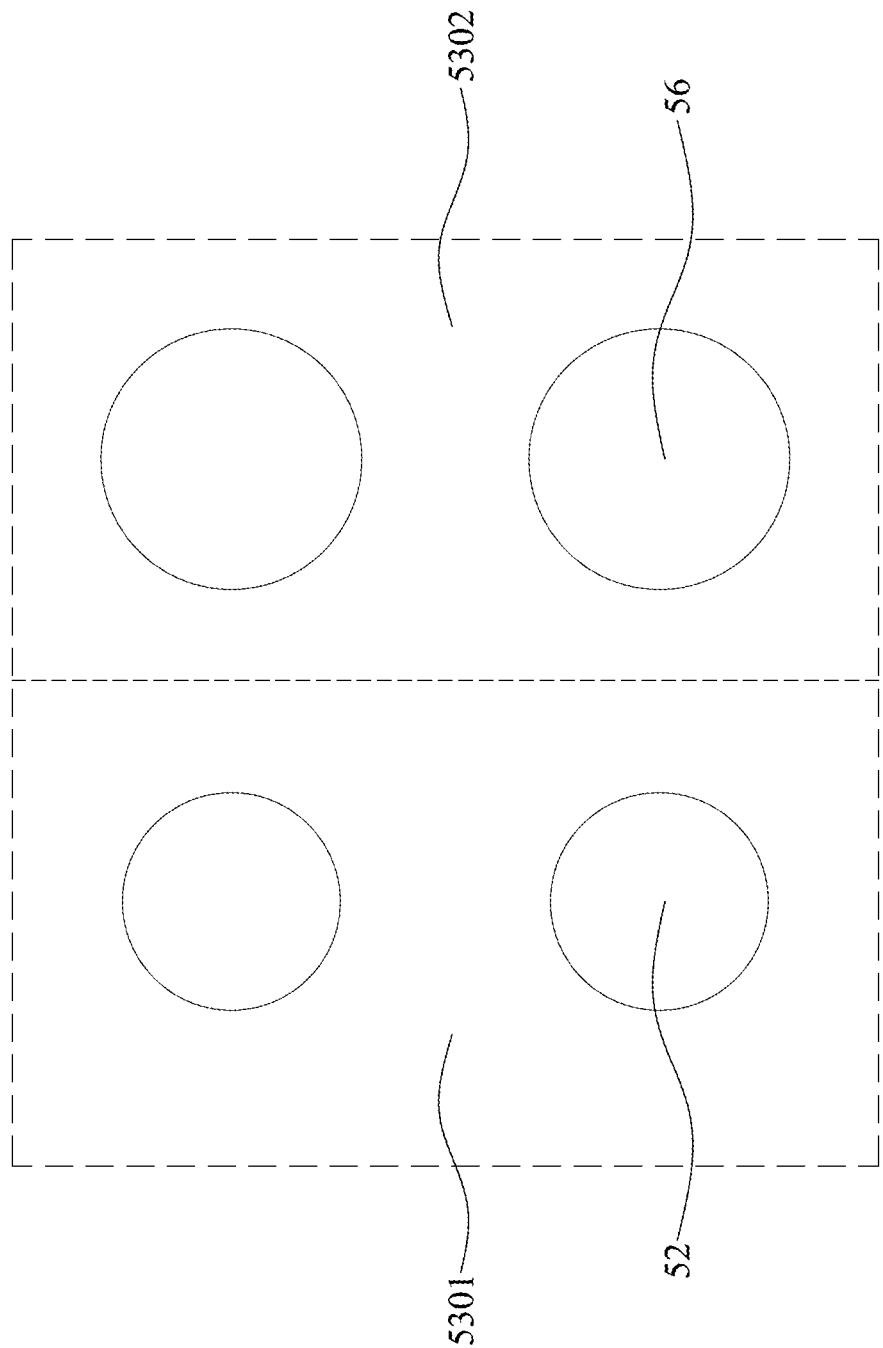
FIG. 5C illustrates a cross-sectional view along line B-B in FIG. 5B.

FIG. 5C illustrates a cross-sectional view along line B-B in FIG. 5B. Referring to FIG. 5C, an area of the electrical connection 56 is greater than an area of the electrical connection 52.

FIG. 6A, FIG. 6B, FIG. 6C, FIG. 6D, FIG. 6E, FIG. 6F, FIG. 6G and FIG. 6H illustrate a method of manufacturing a semiconductor device package in accordance with another embodiment of the instant disclosure.

Figure 6A:
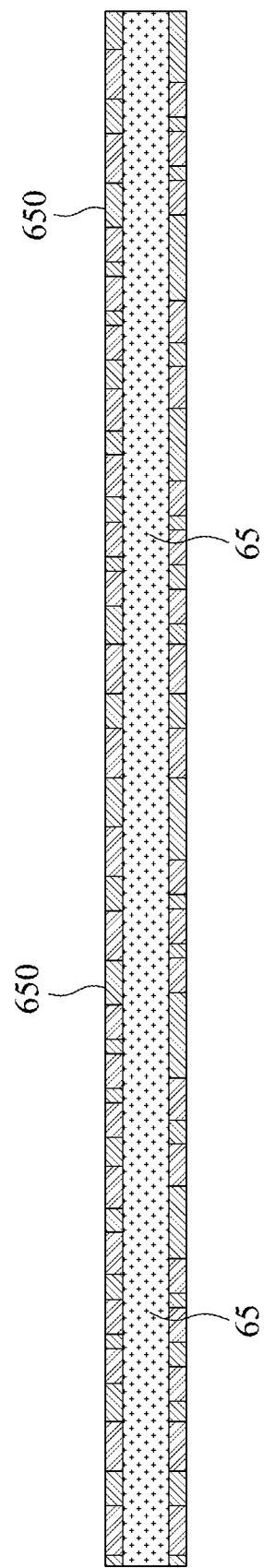
FIG. 6A, FIG. 6B, FIG. 6C, FIG. 6D, FIG. 6E, FIG. 6F, FIG. 6G and FIG. 6H illustrate a method of manufacturing a semiconductor device package in accordance with another embodiment of the instant disclosure.

Referring to FIG. 6A, a strip, panel or matrix of sub-carriers 65 is provided. Each of the sub-carrier 65 may include traces, pads or interconnections for electrical connection.

Figure 6B:
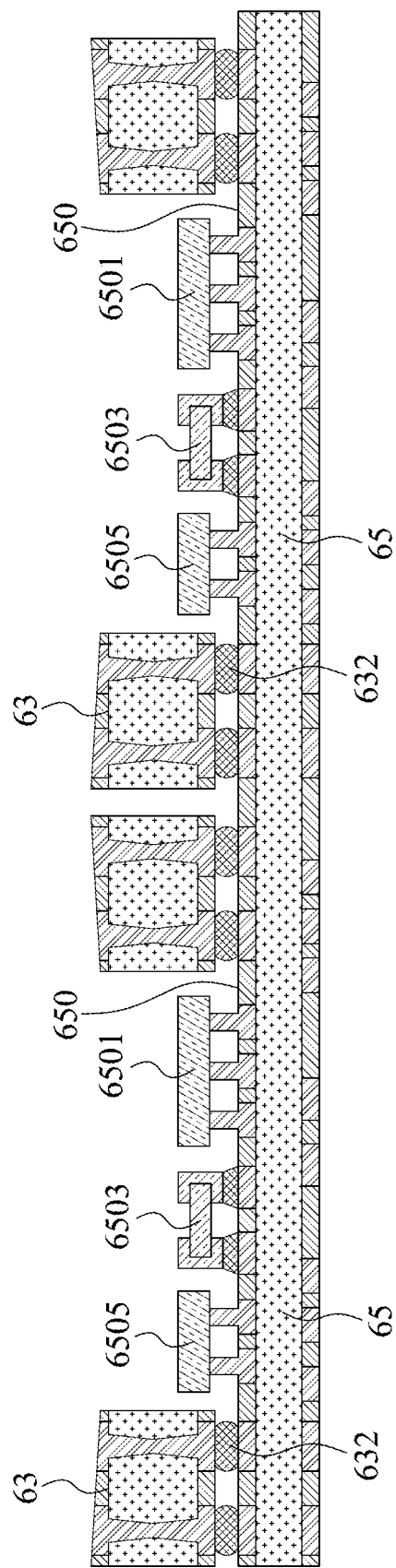

Referring to FIG. 6B, the interposers 63 and electronic components 6501, 6503 and 6505 are disposed or mounted on surfaces 650 of the sub-carriers 65. The electrical connections 632 of the interposers 63 connects the surfaces 650 of the sub-carriers 65, so that the interposers 63 electrically connect the sub-carriers 65 via the electrical connections 632. The electronic component 6501, 6503 and 6505 may be a die, an active device, a passive device, and/or other electronic devices. In some embodiments of the present disclosure, the electronic components 6501, 6503 and 6505 may electrically connect the sub-carrier 65 via electrical connections. Further, as shown in FIG. 6B, the thickness of the interposer 63 is not substantially uniform, and thus the interposer 63 has a thickness difference and the surface 6313 is not substantially parallel to the surface 650 of the sub-carrier 65.

Figure 6C:
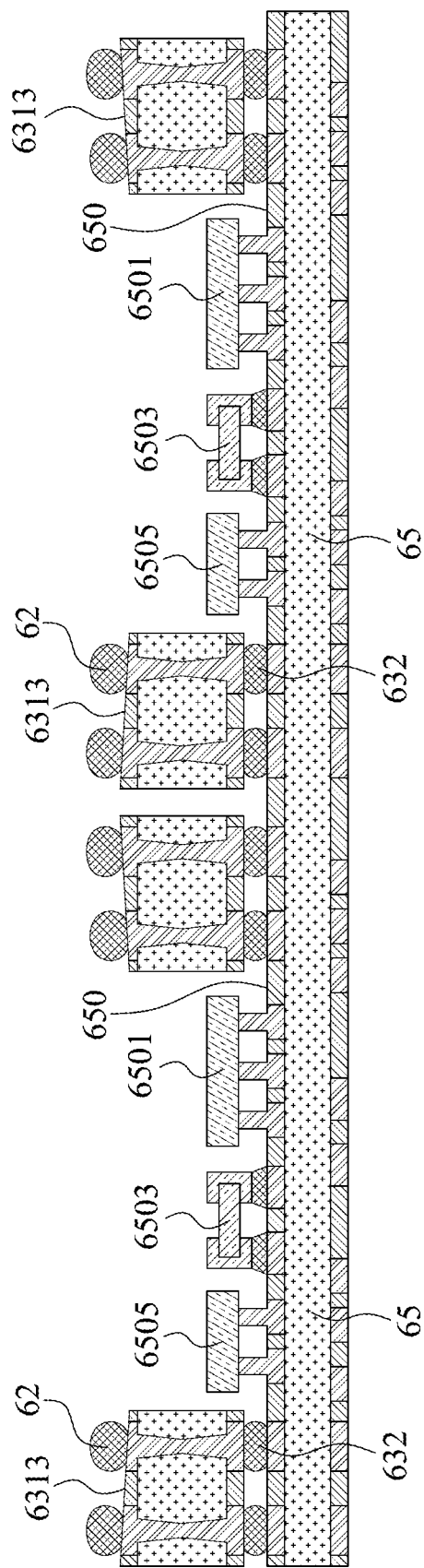

Referring to FIG. 6C, a number of electrical connections 62 and 66 are disposed or mounted on surfaces 6313 of the substrates 631 of the interposers 63. In some embodiments of the present disclosure, the electrical connections 62, 66 include solder material. The electrical connections 62, 66 may include solder balls. As shown in FIG. 6C, the electrical connection 62 is connected to the portion of the interposer 63 which has the smaller thickness, and the electrical connection 66 is connected to the portion of the interposer 63 which has the greater thickness. The total thickness variation (TTV) of the electrical connection 62, 66 the interposer 61 and the sub-carrier 65 may be greater than 10 μm.

Figure 6D:
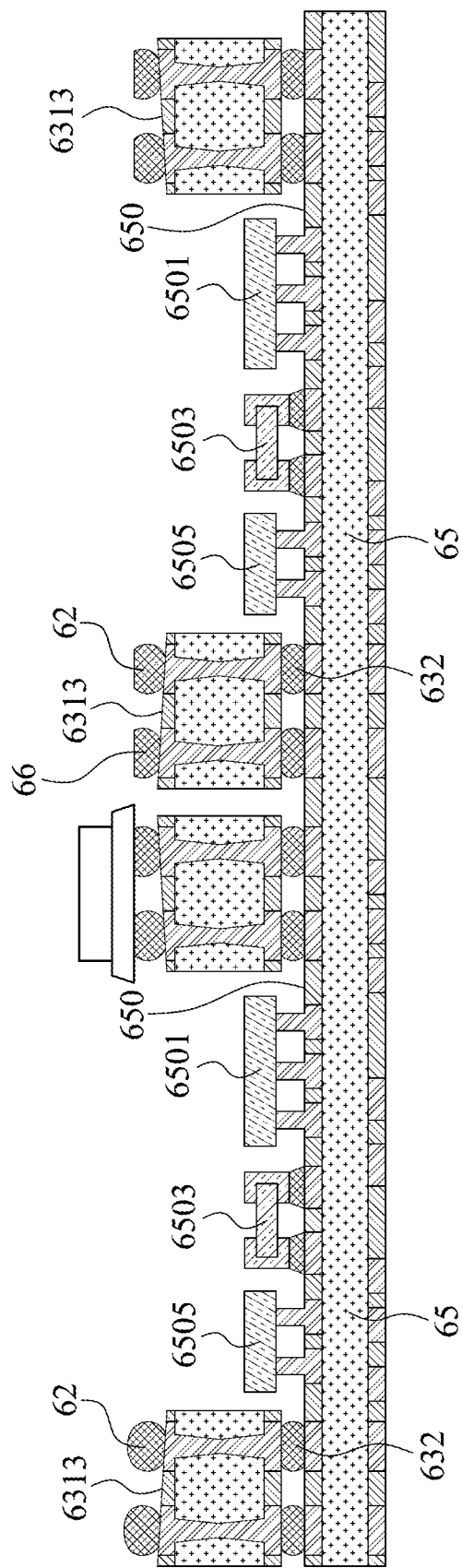

Referring to FIG. 6D, portions of the electrical connections 62, 66 are removed by, for example, a grinding operation, so that the electrical connection 62, 66 could be planarized. As shown in FIG. 6G, the portions of the electrical connections 62, 66 may be removed by a tool for performing the grinding operation. Further, the removed portion of the electrical connection 66 may be greater than the removed portion of the electrical connection 62. After planarizing the electrical connection 62, the total thickness variation (TTV) of the electrical connection 62, 66 the interposer 61 and the sub-carrier 65 may be smaller than 10 μm.

Figure 6E:
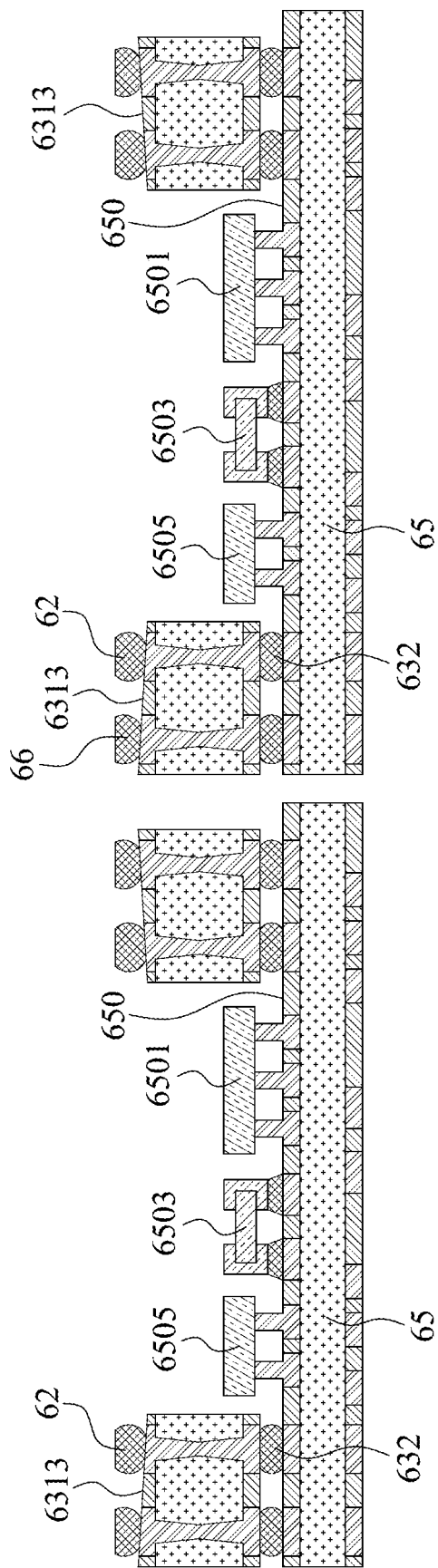

Referring to FIG. 6E, the sub-substates 65 are separated from each other by a singulation operation.

Figure 6F:
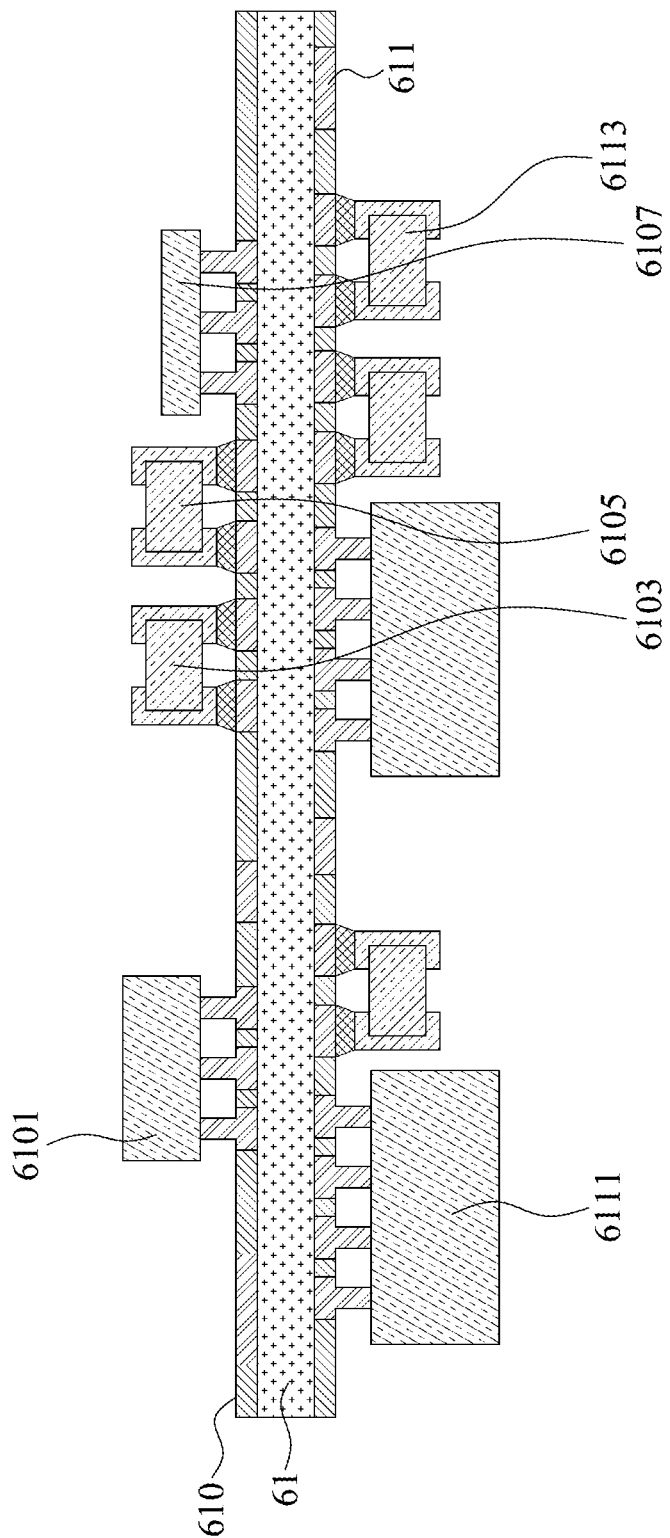
Figure 6G:
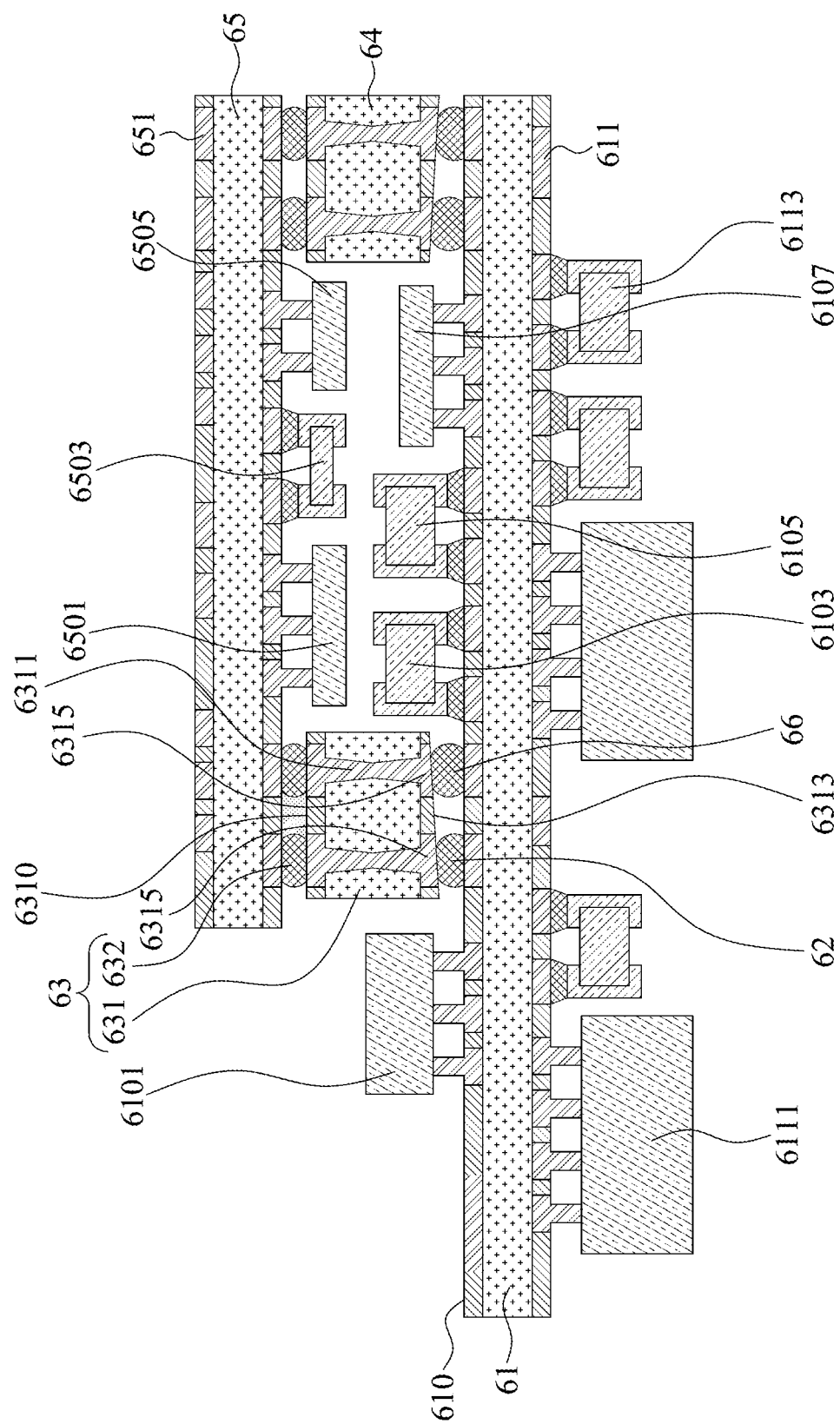

Referring to FIG. 6F, a main carrier 61 is provided. The main carrier 61 may include traces, pads or interconnections for electrical connection. Electronic components 6101, 6013, 6105 and 6107 are disposed or mounted on a surface 610 of the main carrier 61, and electronic components 6111 and 6113 are disposed or mounted on a surface 613 of the main carrier 61. The electronic component 6101, 6103, 6105, 6107, 6111 and 6113 may be a die, an active device, a passive device, and/or other electronic devices. In some embodiments of the present disclosure, the electronic components 6101, 6103, 6105, 6107, 6111 and 6113 may electrically connect the main carrier 61 via electrical connections.

Referring to 6G, the sub-carrier 65 with the interposers 63, the electronic components 6501, 6503 and 6505 and the electrical connections 62, 66 are disposed on the surface 610 of the main carrier 61. As shown in FIG. 6G, the interposer 63 may be mounted on the surface 610 of the main carrier 61 via the electrical connections 62, 66, so that the sub-carrier 65 may electrically connect the main carrier 61 via the interposer 61 and the electrical connections 62, 66. In some embodiments of the present disclosure, a flux is dipped on the electrical connections 62, 66 when the sub-carrier 65 with the interposers 63, the electronic components 6501, 6503 and 6505 and the electrical connections 62, 66 are mounted on the surface 610 of the main carrier 61. That is, the electrical connections 62 are mounted on the surface 610 of the main carrier 61 by a flux dipping process.

Figure 6H:
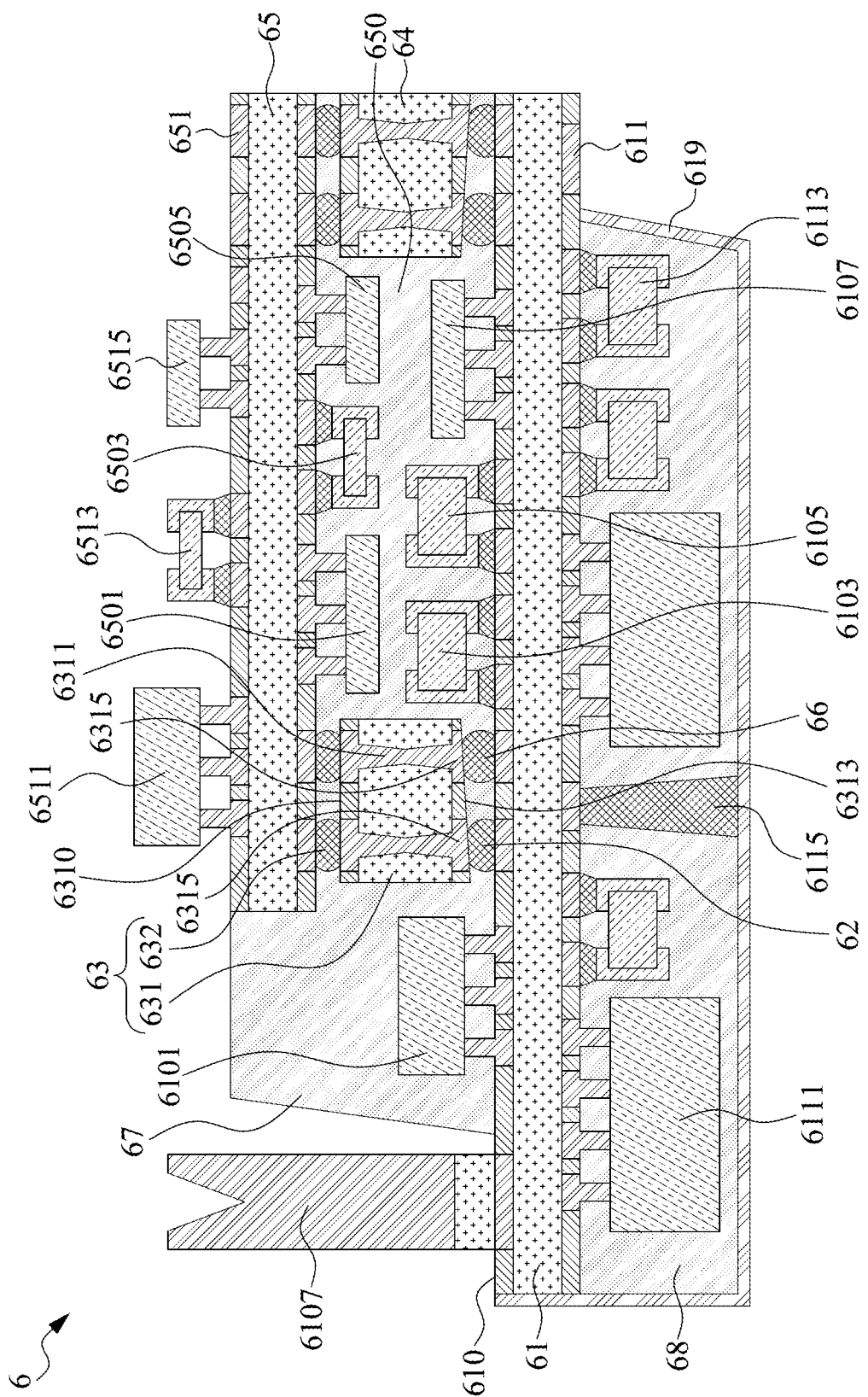

Referring to FIG. 6H, an encapsulant 67 is formed on the surface 610 of the main carrier 61 and an encapsulant 68 is formed on the surface 611 of the main carrier. As shown in FIG. 6H, the encapsulant 67 is configured to cover the surface 610 of the main carrier 61, the electrical connections 62, 66, the interposers 61, the surface 650 of the sub-carrier 65 and the electronic components 6101, 6013, 6105, 6501, 6505 and 6505. A portion of the surface of the surface 610 of the main carrier 61, and a connector 6107 is disposed or mounted on the portion of the surface 610 of the main carrier 61. Further, electronic components 6511, 6513, 6515 are disposed or mounted on a surface 651 of the sub-carrier 65. The electronic component 6511, 6513, 6515 may be a die, an active device, a passive device, and/or other electronic devices. In some embodiments of the present disclosure, the electronic components 6511, 6513, 6515 may electrically connect the sub-carrier 65 via electrical connections. The encapsulant 68 is configured to cover the surface 611 of the main carrier and the electronic components 6111 and 6113. Further, a shield layer 619 is formed on the encapsulant 68, and a conductive via 6115 is formed in the encapsulant 68 and connect the surface 611 of the main carrier 61 and the shield layer 619.

After the manufacturing process as shown in FIG. 6A, FIG. 6B, FIG. 6C, FIG. 6D, FIG. 6E, FIG. 6F, FIG. 6G, and FIG. 6H, the semiconductor device package 6 is formed (see FIG. 6H). In some embodiments of the present disclosure, the semiconductor device package 6 is the same as, or similar to, the semiconductor device package 5 shown in FIG. 5A.

Figure 7:
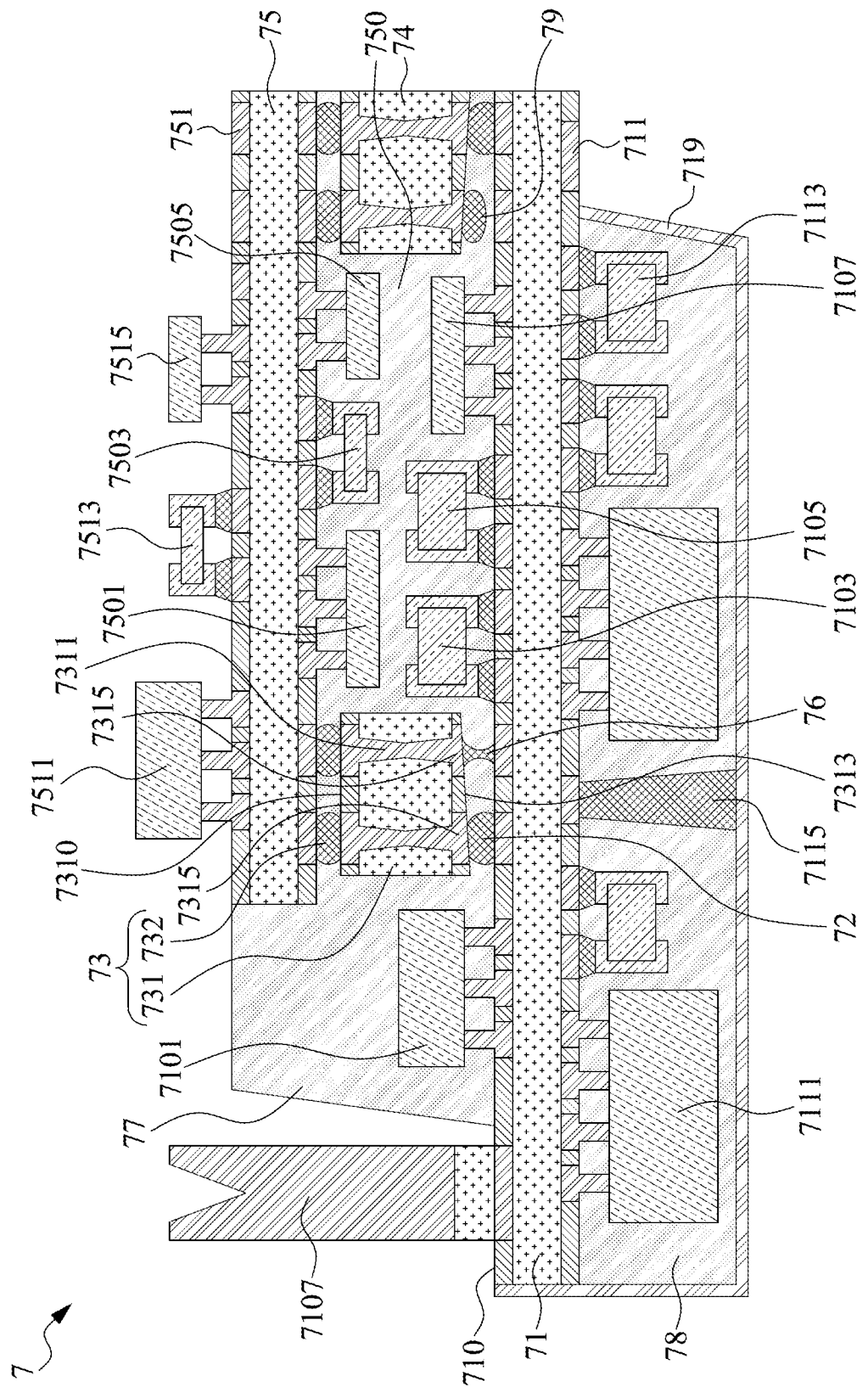
FIG. 7 is a cross-sectional view of a semiconductor device package in accordance with an embodiment of the instant disclosure.

FIG. 7 is a cross-sectional view of a semiconductor device package 7 in accordance with some embodiments of the present disclosure. As shown in FIG. 7, the semiconductor device package 7 includes a main carrier 71, an interposer 73 and a sub-carrier 75. In some embodiments, the main carrier 71 includes a substrate, which may be a core substrate or a core-less substrate and may include traces, pads or interconnections for electrical connection. Referring to FIG. 7, the main carrier 71 has a surface 710 (e.g., an upper surface) and a surface 711 (e.g., a lower surface), and electronic components 7101, 7103, 7105 and 7107 may be disposed or mounted on the surface 710 of the main carrier 71 and electronic components 7111 and 7113 may be disposed or mounted on the surface 711 of the main carrier 71. The electronic component 7101, 7103, 7105, 7107, 7111 and 7113 may be a die, an active device, a passive device, and/or other electronic devices. In some embodiments of the present disclosure, the electronic components 7101, 7103, 7105, 7107, 7111 and 7113 may electrically connect the main carrier 71 via electrical connections.

As shown in FIG. 7, the interposer 73 is disposed or mounted on the surface 510 of the main carrier 71. The interposer 73 may include a substrate 731 and electrical connections 732. The substrate 731 may include conductive vias 7311. In some embodiments of the present disclosure, the conductive via 7311 is a through silicon via (TSV). Further, the substrate 731 includes a surface 7310 (e.g., an upper surface) and the electrical connections 732 are disposed on the surface 7310 of the substrate 731. In some embodiments of the present disclosure, the electrical connection 732 includes solder material. The electrical connection 732 may include a solder ball. Referring to FIG. 7, the interposer 73 electrically connects to the main carrier 71 via electrical connections 72 and 76. That is, the electrical connections 72 and 76 are arranged between the surface 710 of the main carrier 71 and a surface 7313 (e.g., a lower surface) of the substrate 731 of the interposer 73. The substrate 731 of the interposer 73 may include electrodes 7315 at the surface 7313, and the electrical connections 72 and 76 may be connected to the electrodes 7315 of the substrate 731 of the interposer 73. In some embodiments of the present disclosure, the electrode 7315 includes a pad. In some embodiments of the present disclosure, the electrical connections 72 and 76 include solder material used for soldering with the electrodes 7315 of the interposer 73. The electrical connections 72 and 76 may include solder balls.

In addition, the substrate 731 of the interposer 73 does not have the uniform thickness, such that the total thickness of the interposer 73 is non-uniform and the surface 7313 of the substrate 73 is not substantially parallel to the surface 710 of the main carrier 71. Referring to FIG. 7, the electrical connection 76 has a neck portion with a smaller diameter.

The sub-carrier 75 is disposed on the interposers 73. In some embodiments, the sub-carrier 75 includes a substrate, which may be a core substrate or a core-less substrate and may include traces, pads or interconnections for electrical connection. Referring to FIG. 7, the sub-carrier 75 has a surface 750 (e.g., a lower surface) and a surface 751 (e.g., an upper surface), and electronic components 7501, 7503 and 7505 may be disposed or mounted on the surface 750 of the sub-carrier 75 and electronic components 7511, 7513 and 7515 may be disposed or mounted on the surface 751 of the sub-carrier 75. The electronic component 7501, 7503, 7505, 7511, 7513 and 7515 may be a die, an active device, a passive device, and/or other electronic devices. In some embodiments of the present disclosure, the electronic components 7501, 7503, 7505, 7511, 7513 and 7515 may electrically connect the main carrier 75 via electrical connections.

The electrical connections 732 of the interposer 73 is configured to abut and/or connect the surface 750 of the sub-carrier 75. That is, the sub-carrier 75 is electrically connected the interposer 73 via the electrical connections 732.

In some embodiments of the present disclosure, there is another interposer 74 disposed or mounted on the surface 710 of the main carrier 51, and the sub-carrier 55 is disposed on the interposer 74. The interposer 74 is spaced apart from the interposer 73. The electrical connection 79 connected to the interposer 74 does not contact the main carrier 71.

Referring to FIG. 7, an encapsulant 77 (i.e., package body) is disposed on the surface 710 of the main-carrier 71. The encapsulant 77 may cover the surface 710 of the main-carrier 71, the electronic components 7101, 7103, 7105 and 7107 disposed on the surface 710 of the main carrier, the interposers 73 and 74, the electrical connections 72, 76, 79, the surface 750 of the sub-carrier 75 and the electronic components 7501, 7053 and 7505 disposed on the surface 750 of the sub-carrier 75. The encapsulant 77 may include molding compounds, such as a Novolac-based resin, an epoxy-based resin, a silicone-based resin, or other another suitable encapsulant; fillers such as silicon oxide fillers, may be included in the molding compound. In addition, the encapsulant 77 may include a molding underfill (MUF) or a capillary underfill (CUF). Further, as shown in FIG. 7, a portion of the surface 710 of the main carrier 71 is not covered by the encapsulant 77, and the electronic component 7107 is disposed or mounted on the portion of the surface 710 of the main-carrier 71. In some embodiments of the present disclosure, the electronic component 7107 includes a connector which is configured to connect the main carrier 51 to an external electronic component.

Moreover, an encapsulant 78 (i.e., package body) is disposed on the surface 711 of the main carrier 71. The encapsulant 78 may cover the surface 711 of the main-carrier 71 and the electronic components 7111 and 7113 disposed on the surface 711 of the main carrier 71. The encapsulant 78 may include molding compounds, such as a Novolac-based resin, an epoxy-based resin, a silicone-based resin, or other another suitable encapsulant; fillers such as silicon oxide fillers, may be included in the molding compound. In addition, the encapsulant 58 may include a molding underfill (MUF) or a capillary underfill (CUF). In some embodiments of the present disclosure, a conductive layer 719 is formed on the encapsulant 78. The conductive layer 719 may be a shielding layer which electrically connects to the main carrier 71 via a conductive via 7115.

As used herein, the singular terms "a," "an," and "the" may include a plurality of referents unless the context clearly dictates otherwise.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if the difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range were explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein are described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations on the present disclosure.

What is claimed is:

1. An electronic device, comprising:
    a first carrier having a first surface,
    an interposer disposed over the first surface of the first carrier, wherein the interposer has a first thickness and a second thickness in a direction substantially perpendicular to the first surface of the first carrier;
    a plurality of electrical connections between the first carrier and the interposer and configured to compensate a difference between the first thickness and the second thickness of the interposer;
    a second carrier disposed over the interposer and an interconnection connecting the second carrier and the interposer;
    a first electronic component and a second electronic component between the first carrier and the second carrier, wherein the first component is arranged above the second component and separated from the second component;
    a package body covering the first carrier, the second carrier, the interposer, the electrical connections and the first and second electronic components; and a connector disposed on the first carrier and exposed from the package body, wherein the connector is configured to connect the first carrier to an external device.

2. The electronic device of claim 1, wherein the electrical connections comprise a first electrical connection and a second connection, and wherein a thickness of the first electrical connection is different from a thickness of the second electrical connection.

3. The electronic device of claim 1, wherein the electrical connection comprise a material used for soldering.

4. The electronic device of claim 1, wherein a thickness of the electrical connection is different from a thickness of the interconnection.

5. The electronic device of claim 1, wherein a distance between the second carrier and the interposer is greater than a distance between the first carrier and the interposer.

6. The electronic device of claim 2, wherein the first electrical connection has a first area in a cross-section and the second electrical connection has a second area in the cross-section, and wherein the first area and the second area are different from each other.

7. The electronic device of claim 3, wherein the electrical connection comprises a spacer covered by the material.

8. The electronic device of claim 7, wherein the spacer has a surface substantially facing the first carrier and with a substantially oval-shaped profile.

9. The electronic device of claim 7, wherein the spacer comprises a protrusion protruded from a side surface of the spacer, and wherein a distance between the protrusion of the spacer and the first carrier is smaller than a distance between the protrusion of the spacer and the interposer.

\* \* \* \* \*